(12) United States Patent
Kidd et al.

(10) Patent No.: US 8,976,575 B1
(45) Date of Patent: Mar. 10, 2015

(54) SRAM PERFORMANCE MONITOR

(71) Applicant: SuVolta, Inc., Los Gatos, CA (US)

(72) Inventors: David A. Kidd, San Jose, CA (US); Chao-Wu Chen, San Jose, CA (US); Vineet Agrawal, San Jose, CA (US)

(73) Assignee: SuVolta, Inc., Los Gatos, CA (US)

( * ) Notice: Subject to any disclaimer, the term of this patent is extended or adjusted under 35 U.S.C. 154(b) by 0 days.

(21) Appl. No.: 14/014,076

(22) Filed: Aug. 29, 2013

(51) Int. Cl.
*G11C 7/00* (2006.01)
*G11C 11/419* (2006.01)
*G11C 7/22* (2006.01)

(52) U.S. Cl.
CPC ............... *G11C 11/419* (2013.01); *G11C 7/22* (2013.01)
USPC .......................................... 365/154; 365/205

(58) Field of Classification Search
CPC .................................. G11C 7/08; G11C 11/412
USPC ................................................. 365/154, 205
See application file for complete search history.

(56) References Cited

U.S. PATENT DOCUMENTS

| | | | |
|---|---|---|---|
| 3,958,266 A | 5/1976 | Athanas | |
| 4,000,504 A | 12/1976 | Berger | |
| 4,021,835 A | 5/1977 | Etoh et al. | |
| 4,242,691 A | 12/1980 | Kotani et al. | |
| 4,276,095 A | 6/1981 | Beilstein, Jr. et al. | |
| 4,315,781 A | 2/1982 | Henderson | |
| 4,578,128 A | 3/1986 | Mundt et al. | |
| 4,617,066 A | 10/1986 | Vasudev | |
| 4,761,384 A | 8/1988 | Neppl et al. | |
| 4,819,043 A | 4/1989 | Yazawa et al. | |
| 5,034,337 A | 7/1991 | Mosher et al. | |
| 5,144,378 A | 9/1992 | Hikosaka | |
| 5,156,989 A | 10/1992 | Williams et al. | |
| 5,156,990 A | 10/1992 | Mitchell | |
| 5,166,765 A | 11/1992 | Lee et al. | |

(Continued)

FOREIGN PATENT DOCUMENTS

| | | |
|---|---|---|
| EP | 0274278 A1 | 7/1988 |
| JP | 59-193066 A | 11/1984 |

(Continued)

OTHER PUBLICATIONS

Abiko, H et al., "A Channel Engineering Combined with Channel Epitaxy Optimization and TED Suppression for 0.15μm n-n Gate CMOS Technology", 1995 Symposium on VLSI Technology Digest of Technical Papers, pp. 23-24, 1995.

(Continued)

*Primary Examiner* — Michael Tran
(74) *Attorney, Agent, or Firm* — Darryl G. Walker

(57) ABSTRACT

A semiconductor circuit can include an array of static random access memory (SRAM) cells. A first SRAM cell may provide a first current through an insulated gate field effect transistor (IGFET) having a first conductivity type. A second SRAM cell may provide a second current through an IGFET having a second conductivity type. A first current division slew circuit can provide a first slew output current proportional to the first current to change the charge on a first slew capacitor. A second current division slew circuit can provide a second slew output current proportional to the second current to change the charge on a second slew capacitor. A pulse may be generated having a first edge determined by a launch signal and a second edge determined by the time the first or the second capacitor reach a predetermined potential.

19 Claims, 10 Drawing Sheets

(56) References Cited

U.S. PATENT DOCUMENTS

| | | |
|---|---|---|
| 5,208,473 A | 5/1993 | Komori et al. |
| 5,298,763 A | 3/1994 | Shen et al. |
| 5,331,220 A | 7/1994 | Pierce et al. |
| 5,369,288 A | 11/1994 | Usuki |
| 5,384,476 A | 1/1995 | Nishizawa et al. |
| 5,559,368 A | 9/1996 | Hu et al. |
| 5,608,253 A | 3/1997 | Liu et al. |
| 5,663,583 A | 9/1997 | Matloubian et al. |
| 5,712,501 A | 1/1998 | Davies et al. |
| 5,719,422 A | 2/1998 | Burr et al. |
| 5,726,488 A | 3/1998 | Watanabe et al. |
| 5,780,899 A | 7/1998 | Hu et al. |
| 5,847,419 A | 12/1998 | Imai et al. |
| 5,856,003 A | 1/1999 | Chiu |
| 5,861,334 A | 1/1999 | Rho |
| 5,877,049 A | 3/1999 | Liu et al. |
| 5,889,315 A | 3/1999 | Farrenkopf et al. |
| 5,895,954 A | 4/1999 | Yasumura et al. |
| 5,923,987 A | 7/1999 | Burr |
| 5,989,963 A | 11/1999 | Luning et al. |
| 6,020,227 A | 2/2000 | Bulucea |
| 6,020,757 A | 2/2000 | Jenkins, IV |
| 6,087,210 A | 7/2000 | Sohn |
| 6,087,691 A | 7/2000 | Hamamoto |
| 6,096,611 A | 8/2000 | Wu |
| 6,103,562 A | 8/2000 | Son et al. |
| 6,121,153 A | 9/2000 | Kikkawa |
| 6,147,383 A | 11/2000 | Kuroda |
| 6,157,073 A | 12/2000 | Lehongres |
| 6,175,582 B1 | 1/2001 | Naito et al. |
| 6,184,112 B1 | 2/2001 | Maszara et al. |
| 6,190,979 B1 | 2/2001 | Radens et al. |
| 6,194,259 B1 | 2/2001 | Nayak et al. |
| 6,218,895 B1 | 4/2001 | De et al. |
| 6,229,188 B1 | 5/2001 | Aoki et al. |
| 6,229,336 B1 | 5/2001 | Felton et al. |
| 6,245,618 B1 | 6/2001 | An et al. |
| 6,288,429 B1 | 9/2001 | Iwata et al. |
| 6,300,177 B1 | 10/2001 | Sundaresan et al. |
| 6,313,489 B1 | 11/2001 | Letavic et al. |
| 6,320,222 B1 | 11/2001 | Forbes et al. |
| 6,326,666 B1 | 12/2001 | Bernstein et al. |
| 6,358,806 B1 | 3/2002 | Puchner |
| 6,380,019 B1 | 4/2002 | Yu et al. |
| 6,391,752 B1 | 5/2002 | Colinge et al. |
| 6,426,279 B1 | 7/2002 | Huster et al. |
| 6,444,550 B1 | 9/2002 | Hao et al. |
| 6,444,551 B1 | 9/2002 | Ku et al. |
| 6,461,920 B1 | 10/2002 | Shirahata |
| 6,461,928 B2 | 10/2002 | Rodder |
| 6,472,278 B1 | 10/2002 | Marshall et al. |
| 6,476,654 B2 | 11/2002 | Tanaka |
| 6,482,714 B1 | 11/2002 | Hieda et al. |
| 6,489,224 B1 | 12/2002 | Burr |
| 6,492,232 B1 | 12/2002 | Tang et al. |
| 6,500,739 B1 | 12/2002 | Wang et al. |
| 6,503,801 B1 | 1/2003 | Rouse et al. |
| 6,506,640 B1 | 1/2003 | Ishida et al. |
| 6,518,623 B1 | 2/2003 | Oda et al. |
| 6,534,373 B1 | 3/2003 | Yu |
| 6,541,829 B2 | 4/2003 | Nishinohara et al. |
| 6,548,842 B1 | 4/2003 | Bulucea et al. |
| 6,551,885 B1 | 4/2003 | Yu |
| 6,573,129 B2 | 6/2003 | Hoke et al. |
| 6,600,200 B1 | 7/2003 | Lustig et al. |
| 6,620,671 B1 | 9/2003 | Wang et al. |
| 6,624,488 B1 | 9/2003 | Kim |
| 6,630,710 B1 | 10/2003 | Augusto |
| 6,637,017 B1 | 10/2003 | Brophy |
| 6,660,605 B1 | 12/2003 | Liu |
| 6,667,200 B2 | 12/2003 | Sohn et al. |
| 6,670,260 B1 | 12/2003 | Yu et al. |
| 6,693,333 B1 | 2/2004 | Yu |
| 6,730,568 B2 | 5/2004 | Sohn |
| 6,737,724 B2 | 5/2004 | Hieda et al. |
| 6,743,291 B2 | 6/2004 | Ang et al. |
| 6,753,230 B2 | 6/2004 | Sohn et al. |
| 6,770,944 B2 | 8/2004 | Nishinohara et al. |
| 6,787,424 B1 | 9/2004 | Yu |
| 6,797,994 B1 | 9/2004 | Hoke et al. |
| 6,808,994 B1 | 10/2004 | Wang |
| 6,821,825 B2 | 11/2004 | Todd et al. |
| 6,822,297 B2 | 11/2004 | Nandakumar et al. |
| 6,831,292 B2 | 12/2004 | Currie et al. |
| 6,881,641 B2 | 4/2005 | Wieczorek et al. |
| 6,881,987 B2 | 4/2005 | Sohn |
| 6,893,947 B2 | 5/2005 | Martinez et al. |
| 6,916,698 B2 | 7/2005 | Mocuta et al. |
| 6,930,007 B2 | 8/2005 | Bu et al. |
| 6,930,360 B2 | 8/2005 | Yamauchi et al. |
| 6,963,090 B2 | 11/2005 | Passlack et al. |
| 7,002,214 B1 | 2/2006 | Boyd et al. |
| 7,008,836 B2 | 3/2006 | Algotsson et al. |
| 7,013,359 B1 | 3/2006 | Li |
| 7,015,546 B2 | 3/2006 | Herr et al. |
| 7,057,216 B2 | 6/2006 | Ouyang et al. |
| 7,061,058 B2 | 6/2006 | Chakravarthi et al. |
| 7,064,039 B2 | 6/2006 | Liu |
| 7,064,399 B2 | 6/2006 | Babcock et al. |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,515 B2 | 8/2006 | Hanafi et al. |
| 7,119,381 B2 | 10/2006 | Passlack |
| 7,170,120 B2 | 1/2007 | Datta et al. |
| 7,176,729 B2 | 2/2007 | Hayashi et al. |
| 7,186,598 B2 | 3/2007 | Yamauchi et al. |
| 7,189,627 B2 | 3/2007 | Wu et al. |
| 7,199,430 B2 | 4/2007 | Babcock et al. |
| 7,202,517 B2 | 4/2007 | Dixit et al. |
| 7,211,871 B2 | 5/2007 | Cho |
| 7,216,272 B2 | 5/2007 | Loh |
| 7,221,021 B2 | 5/2007 | Wu et al. |
| 7,223,646 B2 | 5/2007 | Miyashita et al. |
| 7,226,833 B2 | 6/2007 | White et al. |
| 7,226,843 B2 | 6/2007 | Weber et al. |
| 7,235,822 B2 | 6/2007 | Li |
| 7,294,877 B2 | 11/2007 | Rueckes et al. |
| 7,297,994 B2 | 11/2007 | Wieczorek et al. |
| 7,301,208 B2 | 11/2007 | Handa et al. |
| 7,304,350 B2 | 12/2007 | Misaki |
| 7,312,500 B2 | 12/2007 | Miyashita et al. |
| 7,323,754 B2 | 1/2008 | Ema et al. |
| 7,332,439 B2 | 2/2008 | Lindert et al. |
| 7,348,629 B2 | 3/2008 | Chu et al. |
| 7,354,833 B2 | 4/2008 | Liaw |
| 7,427,788 B2 | 9/2008 | Li et al. |
| 7,442,971 B2 | 10/2008 | Wirbeleit et al. |
| 7,462,908 B2 | 12/2008 | Bol et al. |
| 7,485,536 B2 | 2/2009 | Jin et al. |
| 7,491,988 B2 | 2/2009 | Tolchinsky et al. |
| 7,494,861 B2 | 2/2009 | Chu et al. |
| 7,498,637 B2 | 3/2009 | Yamaoka et al. |
| 7,501,324 B2 | 3/2009 | Babcock et al. |
| 7,507,999 B2 | 3/2009 | Kusumoto et al. |
| 7,521,323 B2 | 4/2009 | Surdeanu et al. |
| 7,531,393 B2 | 5/2009 | Doyle et al. |
| 7,538,412 B2 | 5/2009 | Schulze et al. |
| 7,564,105 B2 | 7/2009 | Chi et al. |
| 7,592,241 B2 | 9/2009 | Takao |
| 7,598,142 B2 | 10/2009 | Ranade et al. |
| 7,605,041 B2 | 10/2009 | Ema et al. |
| 7,605,060 B2 | 10/2009 | Meunier-Beillard et al. |
| 7,605,429 B2 | 10/2009 | Bernstein et al. |
| 7,608,496 B2 | 10/2009 | Chu |
| 7,615,802 B2 | 11/2009 | Elpelt et al. |
| 7,622,341 B2 | 11/2009 | Chudzik et al. |
| 7,642,140 B2 | 1/2010 | Bae et al. |
| 7,645,665 B2 | 1/2010 | Kubo et al. |
| 7,651,920 B2 | 1/2010 | Siprak |
| 7,655,523 B2 | 2/2010 | Babcock et al. |
| 7,675,126 B2 | 3/2010 | Cho |
| 7,678,638 B2 | 3/2010 | Chu et al. |
| 7,681,628 B2 | 3/2010 | Joshi et al. |

(56) References Cited

U.S. PATENT DOCUMENTS

| | | | |
|---|---|---|---|
| 7,682,887 B2 | 3/2010 | Dokumaci et al. |
| 7,683,442 B1 | 3/2010 | Burr et al. |
| 7,696,000 B2 | 4/2010 | Liu et al. |
| 7,704,844 B2 | 4/2010 | Zhu et al. |
| 7,709,828 B2 | 5/2010 | Braithwaite et al. |
| 7,723,750 B2 | 5/2010 | Zhu et al. |
| 7,750,405 B2 | 7/2010 | Nowak |
| 7,750,682 B2 | 7/2010 | Bernstein et al. |
| 7,755,146 B2 | 7/2010 | Helm et al. |
| 7,759,714 B2 | 7/2010 | Itoh et al. |
| 7,772,833 B2 | 8/2010 | Vijayaraghavan et al. |
| 7,795,677 B2 | 9/2010 | Bangsaruntip et al. |
| 7,818,702 B2 | 10/2010 | Mandelman et al. |
| 7,829,402 B2 | 11/2010 | Matocha et al. |
| 7,867,835 B2 | 1/2011 | Lee et al. |
| 7,883,977 B2 | 2/2011 | Babcock et al. |
| 7,888,747 B2 | 2/2011 | Hokazono |
| 7,897,495 B2 | 3/2011 | Ye et al. |
| 7,906,413 B2 | 3/2011 | Cardone et al. |
| 7,906,813 B2 | 3/2011 | Kato |
| 7,919,791 B2 | 4/2011 | Flynn et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,400 B2 | 6/2011 | Cai |
| 7,968,411 B2 | 6/2011 | Williford |
| 8,004,024 B2 | 8/2011 | Furukawa et al. |
| 8,012,827 B2 | 9/2011 | Yu et al. |
| 8,039,332 B2 | 10/2011 | Bernard et al. |
| 8,048,791 B2 | 11/2011 | Hargrove et al. |
| 8,048,810 B2 | 11/2011 | Tsai et al. |
| 8,067,279 B2 | 11/2011 | Sadra et al. |
| 8,105,891 B2 | 1/2012 | Yeh et al. |
| 8,106,424 B2 | 1/2012 | Schruefer |
| 8,106,481 B2 | 1/2012 | Rao |
| 8,119,482 B2 | 2/2012 | Bhalla et al. |
| 8,120,069 B2 | 2/2012 | Hynecek |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,173,502 B2 | 5/2012 | Yan et al. |
| 8,178,430 B2 | 5/2012 | Kim et al. |
| 8,183,096 B2 | 5/2012 | Wirbeleit |
| 8,183,107 B2 | 5/2012 | Mathur et al. |
| 8,236,661 B2 | 8/2012 | Dennard et al. |
| 8,422,946 B2 * | 4/2013 | Bangs et al. | 455/41.1 |
| 8,493,812 B2 * | 7/2013 | Dengler et al. | 365/230.06 |
| 8,755,239 B2 * | 6/2014 | Holla et al. | 365/206 |
| 8,768,679 B2 | 7/2014 | Buck et al. |
| 2001/0014495 A1 | 8/2001 | Yu |
| 2003/0122203 A1 | 7/2003 | Nishinohara et al. |
| 2003/0183856 A1 | 10/2003 | Wieczorek et al. |
| 2004/0075118 A1 | 4/2004 | Heinemann et al. |
| 2004/0084731 A1 | 5/2004 | Matsuda et al. |
| 2005/0116282 A1 | 6/2005 | Pattanayak et al. |
| 2005/0250289 A1 | 11/2005 | Babcock et al. |
| 2006/0022270 A1 | 2/2006 | Boyd et al. |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0154428 A1 | 7/2006 | Dokumaci |
| 2007/0040222 A1 | 2/2007 | Van Camp et al. |
| 2007/0158790 A1 | 7/2007 | Rao |
| 2007/0238253 A1 | 10/2007 | Tucker |
| 2008/0067589 A1 | 3/2008 | Ito et al. |
| 2008/0169493 A1 | 7/2008 | Lee et al. |
| 2008/0197439 A1 | 8/2008 | Goerlach et al. |
| 2008/0227250 A1 | 9/2008 | Ranade et al. |
| 2008/0258198 A1 | 10/2008 | Bojarczuk et al. |
| 2008/0272409 A1 | 11/2008 | Sonkusale et al. |
| 2009/0057746 A1 | 3/2009 | Sugll et al. |
| 2009/0108350 A1 | 4/2009 | Cai et al. |
| 2009/0134468 A1 | 5/2009 | Tsuchiya et al. |
| 2009/0302388 A1 | 12/2009 | Cai et al. |
| 2009/0311837 A1 | 12/2009 | Kapoor |
| 2009/0321849 A1 | 12/2009 | Miyamura et al. |
| 2010/0012988 A1 | 1/2010 | Yang et al. |
| 2010/0038724 A1 | 2/2010 | Anderson et al. |
| 2010/0187641 A1 | 7/2010 | Zhu et al. |
| 2011/0073961 A1 | 3/2011 | Dennard et al. |
| 2011/0074498 A1 | 3/2011 | Thompson et al. |
| 2011/0079860 A1 | 4/2011 | Verhulst |
| 2011/0079861 A1 | 4/2011 | Shifren et al. |
| 2011/0169082 A1 | 7/2011 | Zhu et al. |
| 2011/0175170 A1 | 7/2011 | Wang et al. |
| 2011/0180880 A1 | 7/2011 | Chudzik et al. |
| 2011/0193164 A1 | 8/2011 | Zhu |
| 2012/0021594 A1 | 1/2012 | Gurtei et al. |
| 2012/0056275 A1 | 3/2012 | Cai et al. |
| 2012/0108050 A1 | 5/2012 | Chen et al. |
| 2012/0190177 A1 | 7/2012 | Kim et al. |

FOREIGN PATENT DOCUMENTS

| | | |
|---|---|---|
| JP | 4-186774 A | 7/1992 |
| JP | 8-153873 A | 6/1996 |
| JP | 8-288508 A | 11/1996 |
| JP | 2004087671 A | 3/2004 |
| WO | 2011/062788 A1 | 5/2011 |

OTHER PUBLICATIONS

Chau, R et al., "A 50nm Depleted-Substrate CMOS Transistor (DST)", Electron Device Meeting 2001, IEDM Technical Digest, IEEE International, pp. 29.1.1-29.1.4, 2001.

Ducroquet, F et al. "Fully Depleted Silicon-On-Insulator nMOSFETs with Tensile Strained High Carbon Content Si1-yCy Channel", ECS 210th Meeting, Abstract 1033, 2006.

Ernst, T et al., "Nanoscaled MOSFET Transistors on Strained Si, SiGe, Ge Layers: Some Integration and Electrical Properties Features", ECS Trans. 2006, vol. 3, Issue 7, pp. 947-961, 2006.

Goesele, U et al., Diffusion Engineering by Carbon in Silicon, Mat. Res. Soc. Symp. vol. 610, 2000.

Hokazono, A et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113, 2008.

Hokazono, A et al., "Steep Channel Profiles in n/pMOS Controlled by Boron-Doped Si:C Layers for Continual Bulk-CMOS Scaling", IEDM09-676 Symposium, pp. 29.1.1-29.1.4, 2009.

Holland, OW and Thomas, DK "A Method to Improve Activation of Implanted Dopants in SiC", Oak Ridge National Laboratory, Oak Ridge, TN, 2001.

Kotaki, H., et al., "Novel Bulk Dynamic Threshold Voltage MOSFET (B-DTMOS) with Advanced Isolation (SITOS) and Gate to Shallow-Well Contact (SSSC) Processes for Ultra Low Power Dual Gate CMOS", IEDM 96, pp. 459-462, 1996.

Lavéant, P. "Incorporation, Diffusion and Agglomeration of Carbon in Silicon", Solid State Phenomena, vols. 82-84, pp. 189-194, 2002.

Noda, K et al., "A 0.1-μm Delta-Doped MOSFET Fabricated with Post-Low-Energy Implanting Selective Epitaxy" IEEE Transactions on Electron Devices, vol. 45, No. 4, pp. 809-814, Apr. 1998.

Ohguro, T et al., "An 0.18-μm CMOS for Mixed Digital and Analog Aplications with Zero-Volt-Vth Epitaxial-Channel MOSFET's", IEEE Transactions on Electron Devices, vol. 46, No. 7, pp. 1378-1383, Jul. 1999.

Pinacho, R et al., "Carbon in Silicon: Modeling of Diffusion and Clustering Mechanisms", Journal of Applied Physics, vol. 92, No. 3, pp. 1582-1588, Aug. 2002.

Robertson, LS et al., "The Effect of Impurities on Diffusion and Activation of Ion Implanted Boron in Silicon", Mat. Res. Soc. Symp. vol. 610, 2000.

(56) References Cited

OTHER PUBLICATIONS

Scholz, R et al., "Carbon-Induced Undersaturation of Silicon Self-Interstitials", Appl. Phys. Lett. 72(2), pp. 200-202, Jan. 1998.

Scholz, RF et al., "The Contribution of Vacancies to Carbon Out-Diffusion in Silicon", Appl. Phys. Lett., vol. 74, No. 3, pp. 392-394, Jan. 1999.

Stolk, PA et al., "Physical Mechanisms of Transient Enhanced Dopant Diffusion in Ion-Implanted Silicon", J. Appl. Phys. 81(9), pp. 6031-6050, May 1997.

Thompson, S et al., "MOS Scaling: Transistor Challenges for the 21st Century", Intel Technology Journal Q3' 1998, pp. 1-19, 1998.

Wann, C. et al., "Channel Profile Optimization and Device Design for Low-Power High-Performance Dynamic-Threshold MOSFET", IEDM 96, pp. 113-116, 1996.

Werner, P et al., "Carbon Diffusion in Silicon", Applied Physics Letters, vol. 73, No. 17, pp. 2465-2467, Oct. 1998.

Yan, Ran-Hong et al., "Scaling the Si MOSFET: From Bulk to SOI to Bulk", IEEE Transactions on Electron Devices, vol. 39, No. 7, Jul. 1992.

\* cited by examiner

SRAM PERFORMANCE MONITOR

TECHNICAL FIELD

The present invention relates generally to performance monitors, and more particularly to performance monitor that may improve transistor characteristic measurement accuracy in an SRAM.

BACKGROUND OF THE INVENTION

Process variations can cause component characteristics on a semiconductor device to greatly vary. A static random access memory (SRAM) cell can store a logic one or a logic zero level. A logic one may have a current path through a p-channel insulated gate field effect transistor (IGFET) and a logic zero may have a current path through an n-channel IGFET during a read operation.

The electrical performance characteristics of the different transistor device types in an integrated circuit are subject to variations stemming from factors such as manufacturing process drift, temperature and other effects that result in speed, minimum supply voltage and other variability constraints at the chip level. Such fluctuations are typically comprehended in a "design window" where a certain degree of assumed range from performance (speed) midpoint is built in to those rules and tools as margin from which the integrated circuits are designed. However, design window constraint by definition places limitations on the degree of freedoms for design. Design windows generally comprehend transistor "fast" and "slow" corners within which circuit designers would be constrained in building reliable circuits, for instance, incorporating design redundancy, set timing conservatively and other factors that affect a design implementation of any starting point architecture.

DETAILED DESCRIPTION OF THE EMBODIMENTS

Figure 1:
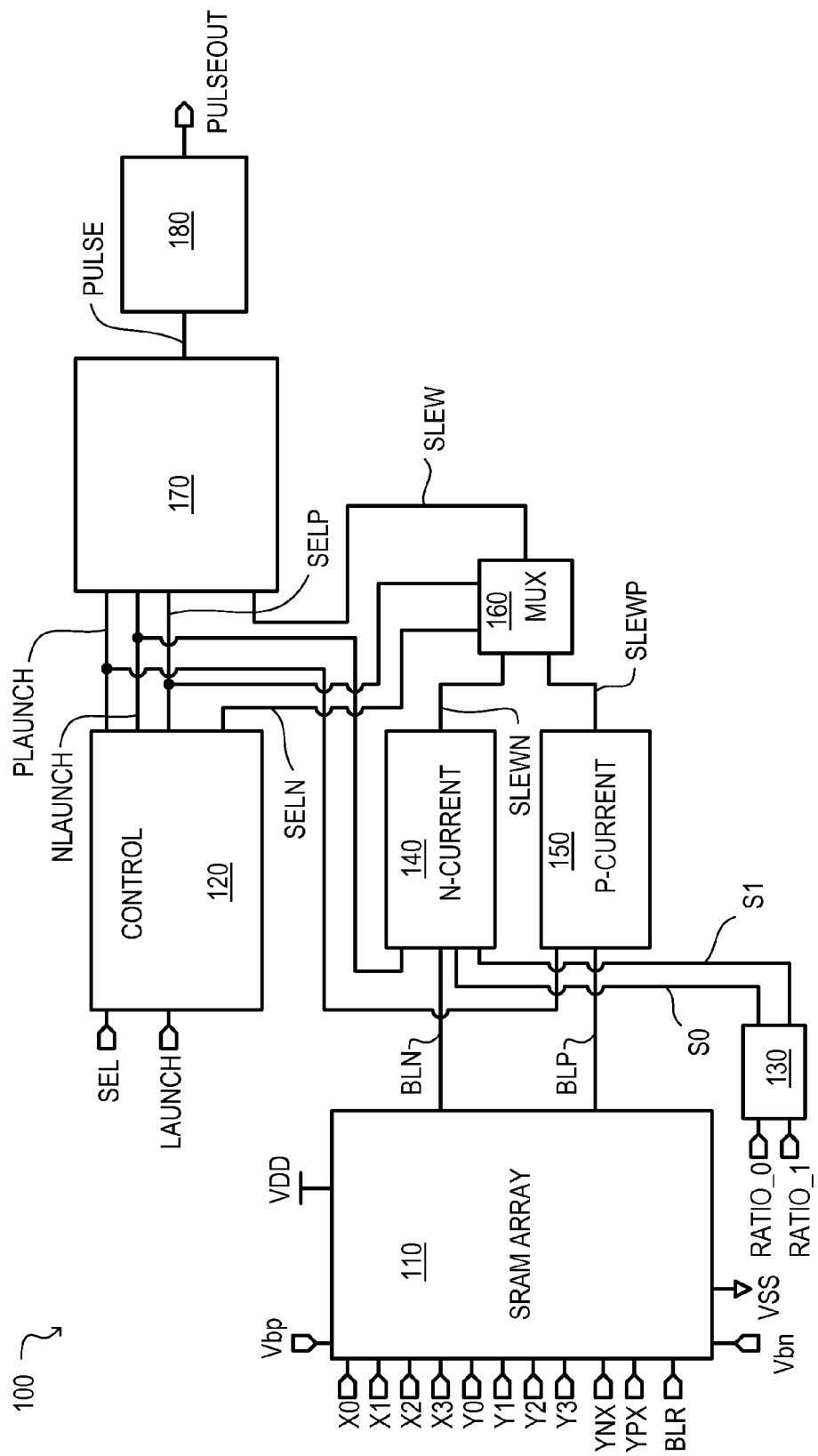
FIG. 1 is a block schematic diagram of a static random access memory (SRAM) performance monitor circuit according to a first embodiment.

Various embodiments of the present invention will now be described in detail with reference to a number of drawings. The embodiments show transistor array circuits and methods constructed with insulated gate field effect transistors (IGFETs), for example IGFETs of complementary conductivity types (n-channel and p-channel types). In particular, the embodiments may include implementations using IGFETs designed for reduced power supply, for instance, power supply reduction of 5% to 50% from standard. Threshold voltages may be reduced, or power supplies may be reduced sufficiently as to move the operation of the circuit into regimes that are outside of the normal linear operation. In some embodiments, the absolute value of threshold voltage VT, may be about 0.4 volts for n-channel IGFETs and about −0.4 volts for p-channel IGFETs as compared to about 0.6 volts and −0.6 volts, respectively in conventional cases. Such reduced threshold voltage IGFETs may comprise DDC technology, as but one example.

DDC transistors are particularly advantageous for the embodiments herein based on the ability to reliably set threshold voltage with substantially reduced variation compared with conventional planar CMOS transistors. DDC transistors lend themselves to allowing for reliable circuit design that can be more aggressive (within a tighter design window) and, if desired, outside of a standard linear regime. DDC transistors also are amenable to 4-terminal design. Using body bias, DDC transistors can be adjusted in real time (dynamic bias) or statically for instance, at test, to modify performance to meet stringent targets even in the case of performance fluctuation (due to endemic issues such as process manufacturing drift). DDC transistors are highly reliable for turning on and off with reduced variation in threshold voltage from transistor to transistor. DDC transistors therefore are advantageous for use in more aggressive circuit designs, i.e., designs with smaller design windows.

A typical embodiment of a DDC transistor includes the use of a heavily doped region below a substantially undoped channel. Further discussion regarding transistor structure and methods of implementation is provided in U.S. Pat. No. 8,273,617 entitled ELECTRONIC DEVICES AND SYSTEMS, AND METHODS FOR MAKING AND USING THE SAME, which disclosure is incorporated by reference herein in its entirety.

Note that other types of IGFETs may be used in implementations of embodiments of this disclosure. For instance, IGFETs that are not planar but three-dimensional. IGFETs useful in implementations herein may be produced on bulk silicon or on a substrate that has an insulating layer embedded therein.

A useful scheme for applying body bias is in the context of detecting "process corners", in other words, monitoring, through the measurement of defined metrics, the state of a circuit against a centerpoint. Through such monitoring, transistor performance against specification can be determined. The reasons for transistor performance variance against specification can also be determined, for instance, a drift in semiconductor process leading to a change in speed, power leakage and other metrics of transistors. With measured performance metrics, then the transistors can be "corrected" to by way of applied body bias. For instance, if speed has dropped below specification, body bias can be used to adjust the threshold voltage of the affected transistors to bring the speed of the integrated circuit back to specification. Body bias can be applied either during operation or at test, either to make dynamic adjustments or static modifications to selected transistors to render the integrated circuit operational within a target performance window. To determine the appropriate body bias-based threshold voltage adjustment, transistors in the integrated circuit need to be monitored. Often the monitoring is done using a transistor array as the target for monitoring. An example of a transistor array scheme amenable for monitoring performance is disclosed in U.S. patent application Ser. No. 13/835,327, titled TRANSISTOR ARRAY ARCHITECTURE by Richard S. Roy et. al., which disclosure is incorporated by reference herein in its entirety. Data from measuring the transistors can be compiled and analyzed in a comparator which feeds into a pulse generator. Compilation can be based upon measuring the data against a database of values, or the analysis can be run through a comparator program.

Monitoring SRAM transistors is useful for a number of reasons. In a system-on-a-chip integrated circuit, SRAM tends to be large and is a significant component of the overall power consumption and of the integrated circuit. Fluctuations in SRAM devices are usually comprehended in large design windows, but the design windows become constraints to making SRAM performance as high as it otherwise could be, or as small as it otherwise could be, or operated at as low a power as could be. It is desirable to be able to make body bias adjustments to SRAM to pull in the design corners and enable SRAM to operate in a window that is closer to target speeds, etc. Another benefit to monitoring SRAM is to identify issues with, for instance, read and write stability which can affect parametric yield which in turn can be a limiter for SRAM block yield. Applying body bias to make needed corrections to threshold voltages can thus bring discrete out-of-range read and write function to operational, thus saving SRAM from otherwise being rejected due to low yield. Also, SRAM as a monitoring device itself can be useful for mimicking performance characteristics of other logic portions of an integrated circuit and can precisely monitor NMOS and PMOS performance separately. Results from an SRAM monitor can be used to apply bias to other digital regions of the integrated circuit, for instance.

Referring now to FIG. 1, an SRAM performance monitor circuit according to a first embodiment is set forth in a block schematic diagram and designated by the general reference character 100. SRAM performance monitor circuit 100 can include an SRAM array circuit 110, a control circuit 120, a current division selection circuit 130, current division slew circuits (140 and 150), a multiplexer circuit 160, a pulse generator circuit 170, and a pulse width multiplier circuit 180.

SRAM array circuit 110 may receive row selection signals (X0 to X3), column selection signals (Y0 to Y3), precharge signals (YNX and YPX), and reference potential BLR as inputs and may provide data line (BLN and BLP) as outputs. When a SRAM memory cell is selected, data line BLN may be connected to a logic zero stored at a SRAM storage node and data line BLP may be connected to a logic one stored at a SRAM storage node. In this way, data lines (BLN and BLP) may receive complementary current signals. SRAM array circuit 110 may also receive back bias potentials (Vbn and Vbp). Back bias potential Vbn may be connected to a body bias terminal of each n-channel IGFET in the SRAM array circuit 110 and back bias potential Vbp may be connected to a body bias terminal of each p-channel IGFET in the SRAM array 110. In this way, the threshold voltages of the IGFETs in SRAM array circuit 110 may be tightly controlled.

Control circuit 120 may receive a select signal SEL and a launch signal LAUNCH as inputs and may provide launch signals (PLAUNCH and NLAUNCH) and select signals (SELN and SELP) as outputs.

Current division selection circuit 130 may receive ratio select signals (RATIO_0 and RATIO_1) as inputs and may provide buffered ratio select signals (S0 and S1) as outputs. Current division slew circuit 140 may receive launch signal NLAUNCH, buffered ratio select signals (S0 and S1), and data line BLN as inputs and may provide a slew signal SLEWN as an output. Current division slew circuit 150 may receive launch signal PLAUNCH, buffered ratio select signals (S0 and S1), and data line BLP as inputs and may provide a slew signal SLEWP as an output.

Multiplexer circuit 160 may receive slew signals (SLEWN and SLEWP), and select signals (SELN and SELP) as inputs and may provide a slew signal SLEW as an output. Pulse generator circuit 170 may receive launch signals (PLAUNCH and NLAUNCH), select signal SELP, and slew signal SLEW as inputs and may provide a pulse signal PULSE as an output. Pulse width multiplier circuit 180 may receive pulse signal PULSE as an input and may provide a pulse signal PULSEOUT as an output.

SRAM performance monitor circuit 100 may operate to select at least one SRAM memory cell in SRAM array circuit 110 to monitor the performance of the at least one SRAM memory cell in accordance with the width of pulse signal PULSEOUT.

Figure 2:
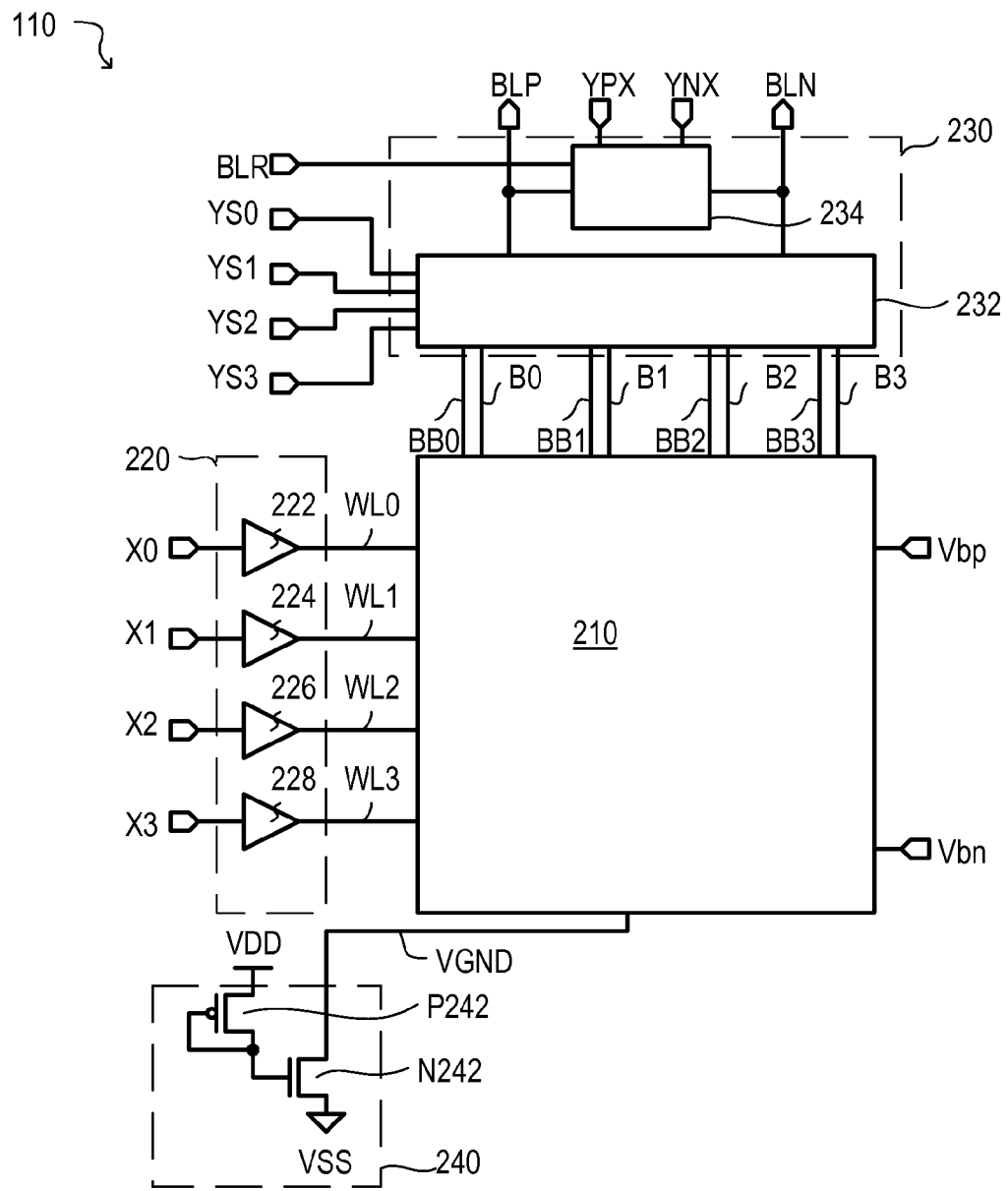
FIG. 2 is a circuit schematic diagram of a SRAM array circuit according to an embodiment.

Referring now to FIG. 2, a circuit schematic diagram of SRAM array circuit 110 is set forth according to an embodiment.

SRAM array circuit 110 can include an array of memory cells 210, a word line driver circuit 220, a bit line selection and precharge circuit 230, and a virtual ground circuit 240.

Word line driver circuit 220 may receive row selection signals (X0 to X3) as inputs and may provide word line signals to word lines (WL0 to WL3) as outputs. Word line drive circuit 220 may include buffers (222, 224, 226, and 228), each buffer may receive a respective row selection signal (X0 to X3) as an input and may output a respective word line signal to a respective word line (WL0 to WL3).

Virtual ground circuit 240 may provide a virtual ground signal VGND. Virtual ground circuit 240 can include an n-channel IGFET N242 and a p-channel IGFET P242. P-channel IGFET P242 can have a source terminal connected to power supply potential VDD and a gate terminal and source terminal commonly connected to a gate terminal of n-channel IGFET N242. N-channel IGFET N242 can have a source terminal connected to a ground potential VSS and a drain terminal connected to provide virtual ground signal VGND. P-channel IGFET P242 and n-channel IGFET N242 are arranged in this embodiment to form a TIE-LOW cell. P-channel IGFET P242 may provide a potential that is one threshold voltage VTP below power supply potential VDD to the gate terminal of n-channel IGFET N242. In this way, n-channel IGFET N242 may be turned on to provide a low impedance path between ground potential VSS and virtual ground signal VGND.

Array of memory cells 210 can receive word line signals on word lines (WL0 to WL3), virtual ground signal VGND, and back bias potentials (Vbp and Vbn) as inputs and may provide output signals on complementary bit line pairs (B0-BB0, B1-BB1, B2-BB2, and B3-BB3).

Bit line selection and precharge circuit 230 can receive column selection signals (YS0 to YS3), complementary bit line pairs (B0-BB0, B1-BB1, B2-BB2, and B3-BB3), reference potential BLR, and precharge signals (YNX and YPX) as inputs and may provide data lines (BLP and BLN) as outputs.

Bit line selection and precharge circuit 230 can include column selection circuit 232 and precharge circuit 234. Column selection circuit can receive column selection signals (YS0 to YS3) and complementary bit line pairs (B0-BB0, B1-BB1, B2-BB2, and B3-BB3) as inputs and may provide outputs connected to data lines (BLP and BLN). Precharge circuit 234 can receive reference potential BLR and precharge signals (YNX and YPX) as inputs and has outputs connected to data lines (BLP and BLN).

Figure 3:
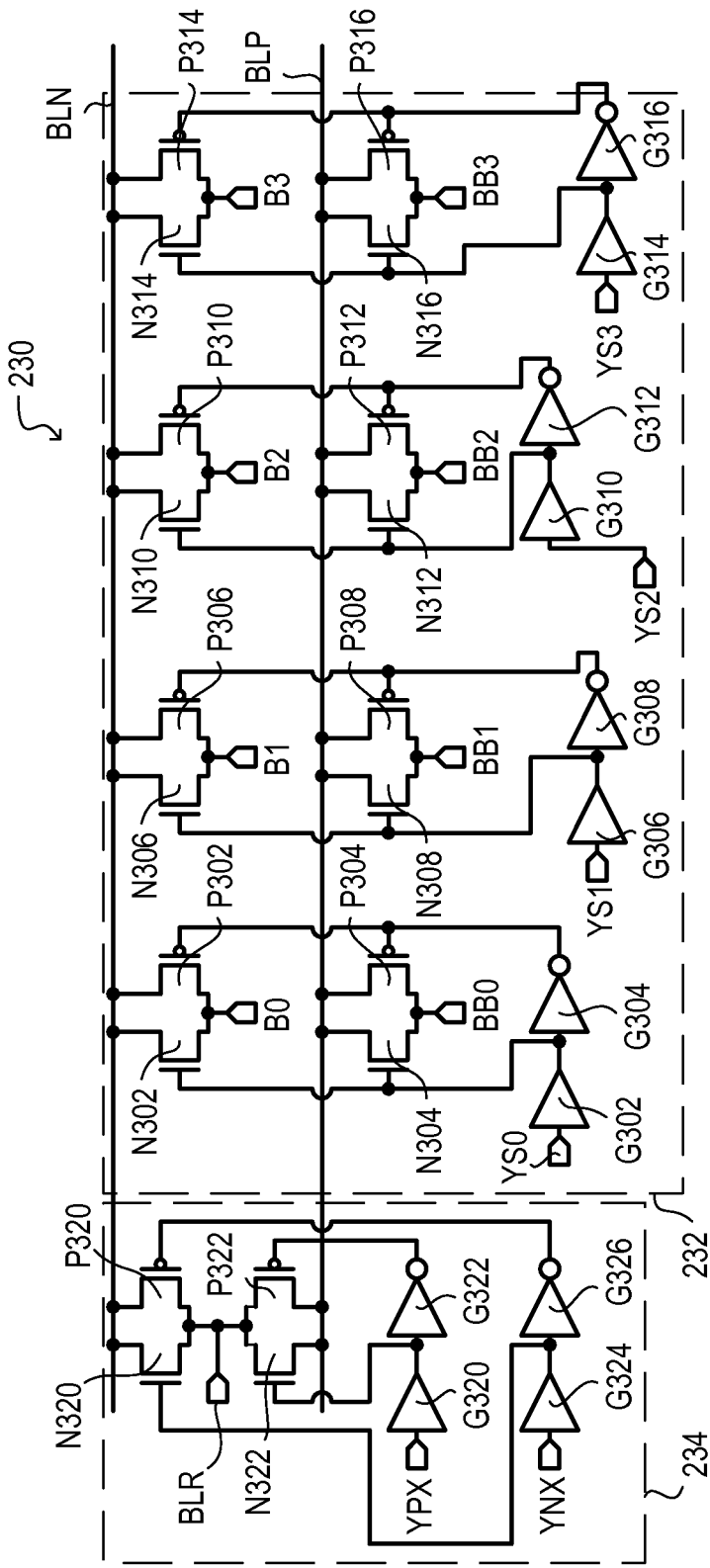
FIG. 3 is a circuit schematic diagram of a bit line selection and precharge circuit according to an embodiment.

Referring now to FIG. 3, a circuit schematic diagram of bit line selection and precharge circuit 230 according to an embodiment is set forth.

Precharge circuit 234 can include buffers (G320 and G324), inverters (G322 and G326), n-channel IGFETs (N320 and N322) and p-channel IGFETs (P320 and P322). Buffer G320 receives precharge signal YPX at an input terminal and provides an output. Inverter G322 receives the output of buffer G320 at an input terminal and provides an output. Buffer G324 receives precharge signal YNX at an input terminal and provides an output. Inverter G326 receives the output of buffer G324 at an input terminal and provides an output. N-channel IGFET N320 receives the output of buffer G324 at a gate terminal and has a first source/drain terminal connected to receive reference potential BLR and a second source/drain terminal connected to data line BLN. P-channel IGFET P320 receives the output of inverter G326 at a gate terminal and has a first source/drain terminal connected to receive reference potential BLR and a second source/drain terminal connected to data line BLN. N-channel IGFET N322 receives the output of buffer G320 at a gate terminal and has a first source/drain terminal connected to receive reference potential BLR and a second source/drain terminal connected to data line BLP. P-channel IGFET P322 receives the output of inverter G322 at a gate terminal and has a first source/drain terminal connected to receive reference potential BLR and a second source/drain terminal connected to data line BLN. In this way, IGFETs (N320 and P320) can form a controllable impedance path between reference potential BLR and data line BLN in response to precharge signal YNX and IGFETs (N322 and P322) can form a controllable impedance path between reference potential BLR and data line BLP in response to precharge signal YPX.

Bit line selection circuit 232 can include buffers (G302, G306, G310, and G314), inverters (G304, G308, G312, and G316), n-channel IGFETs (N302, N304, N306, N308, N310, N312, N314, and N316) and p-channel IGFETs (P302, P304, P306, P308, P310, P312, P314, and P316).

Buffer G302 receives column selection signal YS0 at an input terminal and provides an output. Inverter G304 receives the output of buffer G302 at an input and provides an output. N-channel IGFET N302 receives the output of buffer G302 at a gate terminal and has a first source/drain terminal connected to bit line B0 and a second source/drain terminal connected to data line BLN. P-channel IGFET P302 receives the output of inverter G304 at a gate terminal and has a first source/drain terminal connected to bit line B0 and a second source/drain terminal connected to data line BLN. N-channel IGFET N304 receives the output of buffer G302 at a gate terminal and has a first source/drain terminal connected to bit line BB0 and a second source/drain terminal connected to data line BLP. P-channel IGFET P304 receives the output of inverter G304 at a gate terminal and has a first source/drain terminal connected to bit line BB0 and a second source/drain terminal connected to data line BLP. In this way, IGFETs (N302 and P302) can form a controllable impedance path between bit line B0 and data line BLN and IGFETs (N304 and P304) can form a controllable impedance path between bit line BB0 and data line BLP in response to column selection signal YS0.

Buffer G306 receives column selection signal YS1 at an input terminal and provides an output. Inverter G308 receives the output of buffer G306 at an input and provides an output. N-channel IGFET N306 receives the output of buffer G306 at a gate terminal and has a first source/drain terminal connected to bit line B1 and a second source/drain terminal connected to data line BLN. P-channel IGFET P306 receives the output of inverter G308 at a gate terminal and has a first source/drain terminal connected to bit line B1 and a second source/drain terminal connected to data line BLN. N-channel IGFET N308 receives the output of buffer G306 at a gate terminal and has a first source/drain terminal connected to bit line BB1 and a second source/drain terminal connected to data line BLP. P-channel IGFET P308 receives the output of inverter G308 at a gate terminal and has a first source/drain terminal connected to bit line BB1 and a second source/drain terminal connected to data line BLP. In this way, IGFETs (N306 and P306) can form a controllable impedance path between bit line B1 and data line BLN and IGFETs (N308 and P308) can form a controllable impedance path between bit line BB1 and data line BLP in response to column selection signal YS1.

Buffer G310 receives column selection signal YS2 at an input terminal and provides an output. Inverter G312 receives the output of buffer G310 at an input and provides an output. N-channel IGFET N310 receives the output of buffer G310 at a gate terminal and has a first source/drain terminal connected to bit line B2 and a second source/drain terminal connected to data line BLN. P-channel IGFET P310 receives the output of inverter G312 at a gate terminal and has a first source/drain terminal connected to bit line B2 and a second source/drain terminal connected to data line BLN. N-channel IGFET N312 receives the output of buffer G310 at a gate terminal and has a first source/drain terminal connected to bit line BB2 and a second source/drain terminal connected to data line BLP. P-channel IGFET P312 receives the output of inverter G312 at a gate terminal and has a first source/drain terminal connected to bit line BB2 and a second source/drain terminal connected to data line BLP. In this way, IGFETs (N310 and P310) can form a controllable impedance path between bit line B2 and data line BLN and IGFETs (N312 and P312) can form a controllable impedance path between bit line BB2 and data line BLP in response to column selection signal YS2.

Buffer G314 receives column selection signal YS3 at an input terminal and provides an output. Inverter G316 receives the output of buffer G314 at an input and provides an output. N-channel IGFET N314 receives the output of buffer G314 at a gate terminal and has a first source/drain terminal connected to bit line B3 and a second source/drain terminal connected to data line BLN. P-channel IGFET P314 receives the output of inverter G316 at a gate terminal and has a first source/drain terminal connected to bit line B3 and a second source/drain terminal connected to data line BLN. N-channel IGFET N316 receives the output of buffer G314 at a gate terminal and has a first source/drain terminal connected to bit line BB3 and a second source/drain terminal connected to data line BLP. P-channel IGFET P316 receives the output of inverter G316 at a gate terminal and has a first source/drain terminal connected to bit line BB3 and a second source/drain terminal connected to data line BLP. In this way, IGFETs (N314 and P314) can form a controllable impedance path between bit line B3 and data line BLN and IGFETs (N316 and P316) can form a controllable impedance path between bit line BB3 and data line BLP in response to column selection signal YS3.

Figure 4:
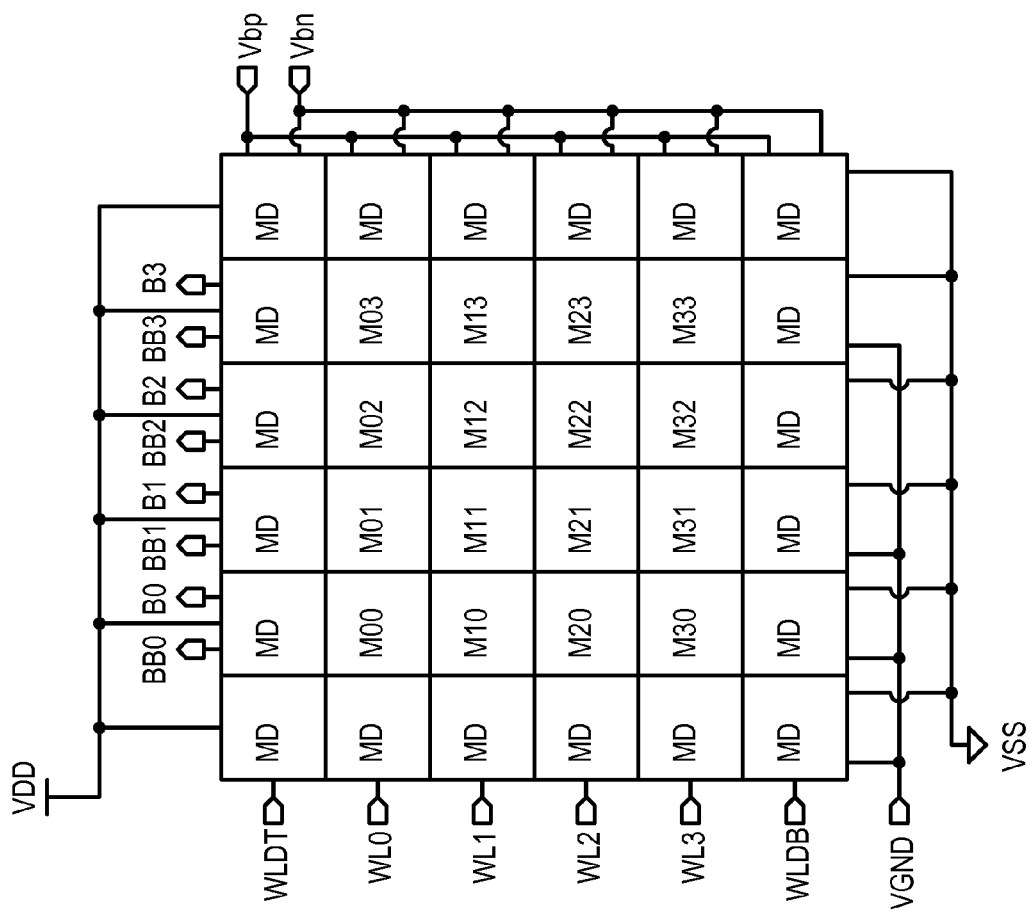
FIG. 4 is a schematic diagram of an array of memory cells to an embodiment.

Referring now to FIG. 4, a schematic diagram of array of memory cells 210 according to an embodiment is set forth.

Array of memory cells 210 may include test memory cells (M00 to M33) arranged in four rows along the word line (WL0 to WL3) direction and four columns along the bit line pair (B0-BB0 to B3-BB3) direction. Dummy memory cells MD may be included in on the external edges of the test memory cells (M00 to M33). Dummy memory cells MD can be included to improve manufacturability. For instance, test memory cells (M00 to M33) can be tightly packed using the minimum allowable design rules in a repetitive pattern and photolithographic inconsistencies can occur at the edges of such repetitive patterns. By providing dummy cells MD at the edges, the inconsistencies may occur at the dummy cells MD, which are not used for storage, instead of the test memory cells (M00 to M33). Rows of dummy cells MD at the edges may include a dummy word line (WLDT and WLDB) which may be connected to ground potential VSS.

Figure 5:
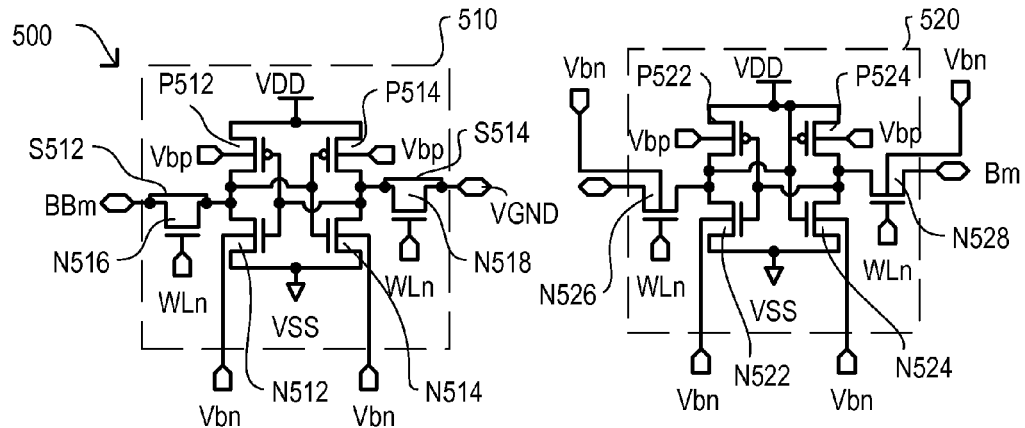
FIG. 5 is a circuit schematic diagram of a test memory cell according to an embodiment.

Referring now to FIG. 5, a circuit schematic diagram of a test memory cell according to an embodiment is set forth and given the general reference character 500. Test memory cell 500 can be used for each test memory cell (M00 to M33) in array of memory cells 210.

Test memory cell 500 may include two SRAM cells (510 and 520). SRAM cell 510 may be configured to test the performance of a p-channel IGFET P512 and SRAM cell 520 may be configured to test the performance of an n-channel IGFET N524.

SRAM cell 510 may include n-channel IGFETs (N512, N514, N516, and N518) and p-channel IGFETs (P512 and P514). N-channel IGFET N512 has a source terminal connected to ground potential VSS and a drain terminal commonly connected to a drain of p-channel IGFET P512, a gate terminal of n-channel IGFET N514, and a gate terminal of p-channel IGFET P514. N-channel IGFET N512 has a gate terminal commonly connected to a gate terminal of p-channel IGFET P512, a gate terminal connected to a drain terminal of n-channel IGFET N514 and a drain terminal of IGFET P514 and a body terminal connected to back bias potential Vbn. P-channel IGFET P512 may have a source connected to power supply potential VDD and a body terminal connected to back bias potential Vbp. N-channel IGFET N514 has a source terminal connected to ground potential VSS and a body terminal connected to back bias potential Vbn. P-channel IGFET P514 may have a source connected to power supply potential VDD and a body terminal connected to back bias potential Vbp. N-channel IGFET N516 may have a gate terminal connected to word line WLn (n=0 to 3) and may have an electrical shunt S512 between the first and second source/drain regions. For instance, N-channel IGFET N512 may be shunted such that bit line BBm (m=0 to 3) may be connected to the drain terminal of p-channel IGFET P512. N-channel IGFET N518 may have a gate terminal connected to word line WLn (n=0 to 3) and may have an electrical shunt between the first and second source/drain regions. For instance, N-channel IGFET N514 may be shunted such that virtual ground potential VGND may be connected to the gate terminal of p-channel IGFET P512.

SRAM cell 510 may differ from a normal SRAM cell in that shunts (S512 and S514), respectively, are provided across the source/drain terminals of n-channel IGFETs (N516 and N518).

With p-channel IGFET P512 having a gate terminal connected to virtual ground potential VGND, p-channel IGFET P512 may be turned on and may provide a low impedance path between power supply potential VDD and bit line BBm. By providing the shunt S512 across the source/drain terminals of n-channel IGFET N516, the poor pull-up characteristics of an n-channel IGFET may be eliminated and the current provided to bit line BBm may only be limited by the strength of p-channel IGFET P512. In this way, SRAM cell 510 is configured to test the performance of a p-channel IGFET P512.

SRAM cell 520 may include n-channel IGFETs (N522, N524, N526, and N528) and p-channel IGFETs (P522 and P524). N-channel IGFET N522 has a source terminal connected to ground potential VSS and a drain terminal commonly connected to a drain of p-channel IGFET P522, a gate terminal of n-channel IGFET N524, and a gate terminal of p-channel IGFET P524. N-channel IGFET N522 has a gate terminal commonly connected to a gate terminal of p-channel IGFET P522, a gate terminal connected to a drain terminal of n-channel IGFET N524 and a drain terminal of IGFET P524 and a body terminal connected to back bias potential Vbn. P-channel IGFET P522 may have a source connected to power supply potential VDD and a body terminal connected to back bias potential Vbp. N-channel IGFET N524 has a source terminal connected to ground potential VSS and a body terminal connected to back bias potential Vbn. P-channel IGFET P524 may have a source connected to power supply potential VDD and a body terminal connected to back bias potential Vbp. N-channel IGFET N526 may have a gate terminal connected to word line WLn (n=0 to 3). N-channel IGFET N526 may have a first source/drain terminal connected to a common drain connection of n-channel IGFET N522 and p-channel IGFET P522 and may have a second source/drain terminal. N-channel IGFET N528 may have a gate terminal connected to word line WLn (n=0 to 3), a first source/drain terminal connected to a common drain connection of n-channel IGFET N524 and p-channel IGFET P524 and may have a second source/drain terminal connected to bit line Bm (m=1 to 3). SRAM cell 520 may differ from a normal SRAM cell in that the gate terminals of n-channel IGFET N524 and p-channel IGFET P524 may be connected to power supply potential VDD.

With the gate terminals of n-channel IGFET N524 and p-channel IGFET P524 connected to power supply potential VDD, n-channel IGFET N524 is turned on and p-channel IGFET P524 is turned off. When word line WLn is activated, n-channel IGFET N528 is turned on and n-channel IGFET N524 may provide a low impedance path between ground potential VSS and bit line Bm.

In this way, SRAM cell 520 is configured to test the performance of n-channel IGFET N524, and tests the combination of N524 and N528 which models a read operation.

Figure 6:
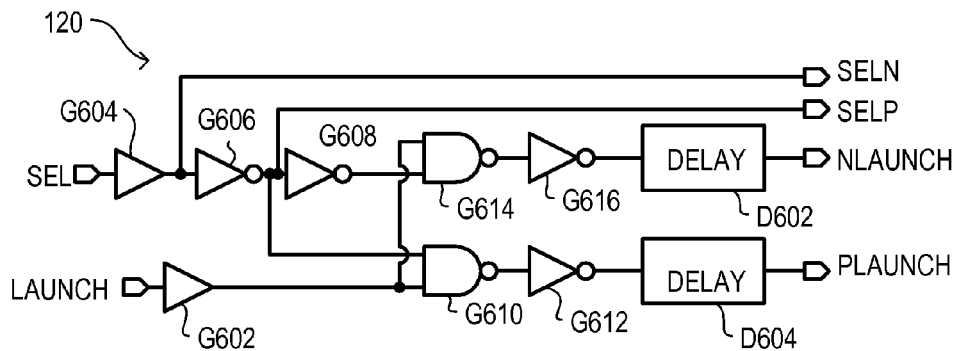
FIG. 6 is a circuit schematic diagram of a control circuit according to an embodiment.

Referring now to FIG. 6, a control circuit 120 according to an embodiment is set forth in a circuit schematic diagram.

Control circuit 120 may receive select signal SEL and a launch signal LAUNCH as inputs and may provide launch signals (PLAUNCH and NLAUNCH) and select signals (SELN and SELP) as outputs. Control circuit 120 may include buffers (G602 and G604), inverters (G606, G608, G612 and G616), NAND gates (G610 and G614), and delay circuits (D602 and D604).

Buffer G602 may receive launch signal LAUNCH at an input terminal and may provide an output. Buffer G604 may receive select signal SEL at an input terminal and may provide select signal SELN as an output. Inverter G606 may receive select signal SELN at an input terminal and may provide select signal SELP as an output. Inverter G606 may receive select signal SELP at an input terminal and may provide an output. NAND gate G610 may receive select signal SELP at a first input terminal and the output of buffer G602 at a second input terminal and may provide an output. Inverter G612 may receive the output of NAND gate G610 at an input terminal and may provide an output. Delay circuit D604 may receive the output of inverter G612 at an input terminal and may provide launch signal PLAUNCH as an output. NAND gate G614 may receive the output of buffer G602 at a first input terminal and the output of inverter G608 at a second input terminal and may provide an output. Inverter G616 may receive the output of NAND gate G614 at an input terminal and may provide an output. Delay circuit D602 may receive the output of inverter G616 at an input terminal and may provide launch signal NLAUNCH as an output.

Figure 7:
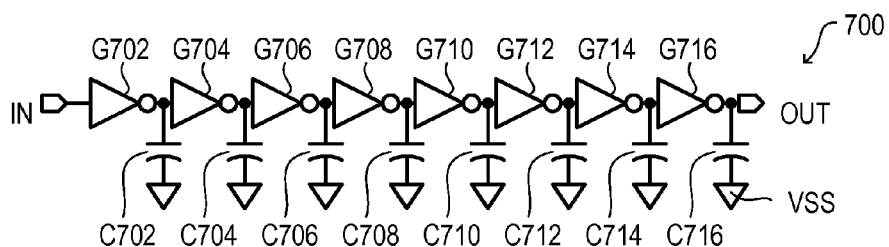
FIG. 7 is a circuit schematic diagram of a delay circuit according to an embodiment.

Referring now to FIG. 7, a delay circuit according to an embodiment is set forth in a circuit schematic diagram and given the general reference character 700. Delay circuit 700 may be used as delay circuits (D602 and D604) in the control circuit 120 of FIG. 6.

Delay circuit 700 can include inverters (G702, G704, G706, G708, G710, G712, G714, and G716) and capacitors (C702, C704, C706, C708, C710, C712, C714, and C716). Inverters (G702, G704, G706, G708, G710, G712, G714, and G716) may be connected in series, with each inverter output terminal being connected to a first terminal of a respective capacitor (C702, C704, C706, C708, C710, C712, C714, and C716). The first inverter G702 in the series connected inverters (G702, G704, G706, G708, G710, G712, G714, and G716) can receive an input signal IN at an input terminal and the last inverter G716 in the series connected inverters (G702, G704, G706, G708, G710, G712, G714, and G716) can provide an output signal OUT at an output terminal. Each capacitor (C702, C704, C706, C708, C710, C712, C714, and C716) can have a second terminal connected to ground potential VSS. In this way, delay circuit 700 can receive an input signal IN and provide a corresponding delayed output signal OUT.

Figure 8:
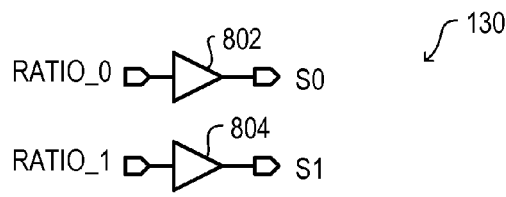
FIG. 8 is a circuit schematic diagram of a current division selection circuit according to an embodiment.

Referring now to FIG. 8, a current division selection circuit 130 according to an embodiment is set forth in a circuit schematic diagram. Current division selection circuit 130 can include buffers (802 and 804). Buffer 802 receives ratio select signal RATIO_0 at an input terminal and provides a buffered ratio select signal S0 at an output terminal. Buffer 804 receives ratio select signal RATIO_1 at an input terminal and provides a buffered ratio select signal S1 at an output terminal.

Figure 9:
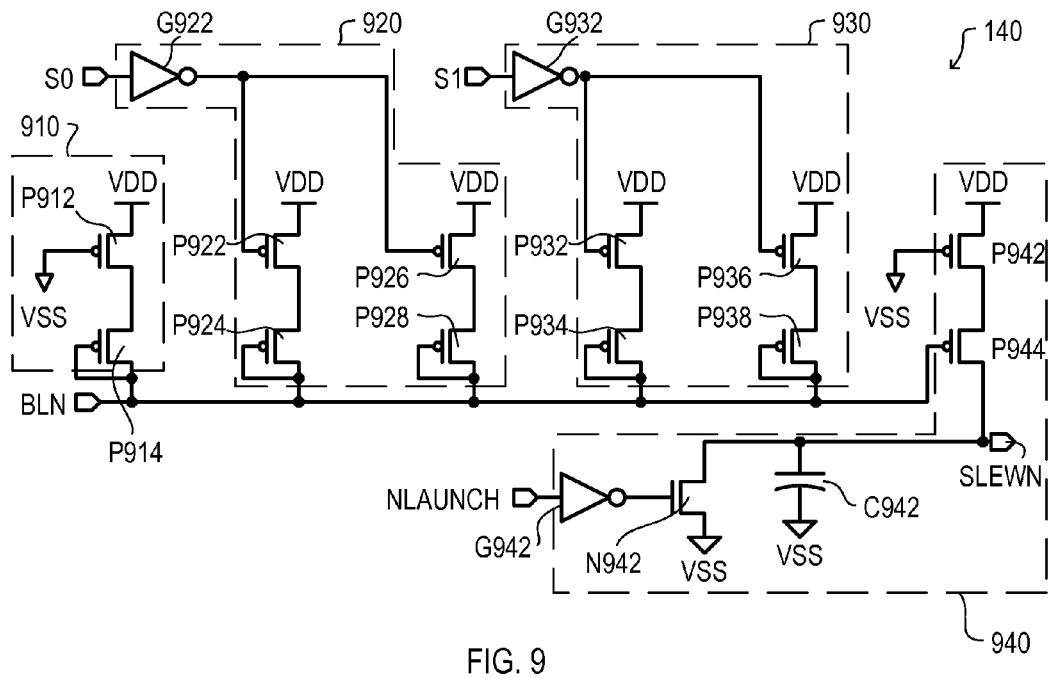
FIG. 9 is a circuit schematic diagram of a current division slew circuit according to an embodiment.

Referring now to FIG. 9, a current division slew circuit 140 according to an embodiment is set forth in a circuit schematic diagram.

Current division slew circuit 140 can include current leg circuit 910, current division circuits (920 and 930), and current output slew circuit 940.

Current leg circuit 910 may include p-channel IGETs (P912 and P914). P-channel IGFET P912 may have a source terminal connected to power supply potential VDD, a gate terminal connected to ground potential VSS, and a drain commonly connected to a source terminal of p-channel IGFET P914. P-channel IGFET P914 can have a gate terminal and drain terminal commonly connected to data line BLN.

Current division circuit 920 can include an inverter G922 and P-channel IGFETs (P922, P924, P926, and P928). Inverter G922 can receive buffered ratio select signal S0 at an input terminal and may provide an output. P-channel IGFET P922 may have a source terminal connected to power supply potential VDD, a gate terminal connected to receive the output of inverter G922, and a drain commonly connected to a source terminal of p-channel IGFET P924. P-channel IGFET P924 can have a gate terminal and drain terminal commonly connected to data line BLN. P-channel IGFET P926 may have a source terminal connected to power supply potential VDD, a gate terminal connected to receive the output of inverter G922, and a drain commonly connected to a source terminal of p-channel IGFET P928. P-channel IGFET P928 can have a gate terminal and drain terminal commonly connected to data line BLN.

Current division circuit 930 can include an inverter G932 and P-channel IGFETs (P932, P934, P936, and P938). Inverter G932 can receive buffered ratio select signal S1 at an input terminal and may provide an output. P-channel IGFET P932 may have a source terminal connected to power supply potential VDD, a gate terminal connected to receive the output of inverter G932, and a drain commonly connected to a source terminal of p-channel IGFET P934. P-channel IGFET P934 can have a gate terminal and drain terminal commonly connected to data line BLN. P-channel IGFET P936 may have a source terminal connected to power supply potential VDD, a gate terminal connected to receive the output of inverter G932, and a drain commonly connected to a source terminal of p-channel IGFET P938. P-channel IGFET P938 can have a gate terminal and drain terminal commonly connected to data line BLN.

Current output slew circuit 940 can include an inverter G942, n-channel IGFET N942, P-channel IGFETs (P942 and P944) and a capacitor C942. Inverter G942 can receive a launch signal NLAUNCH at an input terminal and may provide an output. N-channel IGFET N942 can have a gate terminal connected to receive the output of inverter G942, a source terminal connected to ground potential VSS, and a drain terminal connected to slew signal SLEWN. Capacitor C942 can have a first terminal connected to slew signal SLEWN and a second terminal connected to a ground potential VSS. P-channel IGFET P942 may have a source terminal connected to power supply potential VDD, a gate terminal connected to ground potential VSS, and a drain commonly connected to a source terminal of p-channel IGFET P944. P-channel IGFET P944 can have a gate terminal connected to data line BLN and a source terminal connected to slew signal SLEWN.

Current division slew circuit 140 is essentially a current mirror circuit with a capacitor C942 connected to the output to provide a slew signal SLEWN. When buffered ratio selection signals (S0 and S1) are in a logic low level. P-channel IGFETs (P922, P928, P932, and P936) may be turned off and the current flowing through current leg circuit 910 can be essentially the current flowing through n-channel IGFET N524 (FIG. 5). When launch signal NLAUNCH is a logic high, the current flowing through current leg circuit 910 can be mirrored in current output slew circuit 940 to provide charge to capacitor C942. P-channel IGFET may be included to provide reset function. Buffered ratio selection signals (S0 and S1) may operate to divide the current flowing through current leg circuit 910 from n-channel IGFET N524 (FIG. 5) by three (buffered ratio selection signal S0 is a logic high and buffered ratio selection signal S1 is a logic low) or by five (buffered ratio selection signal S0 is a logic high and buffered ratio selection signal S1 is a logic high). In this way, the slew signal SLEWN may rise more slowly and measurement accuracy may be improved.

Figure 10:
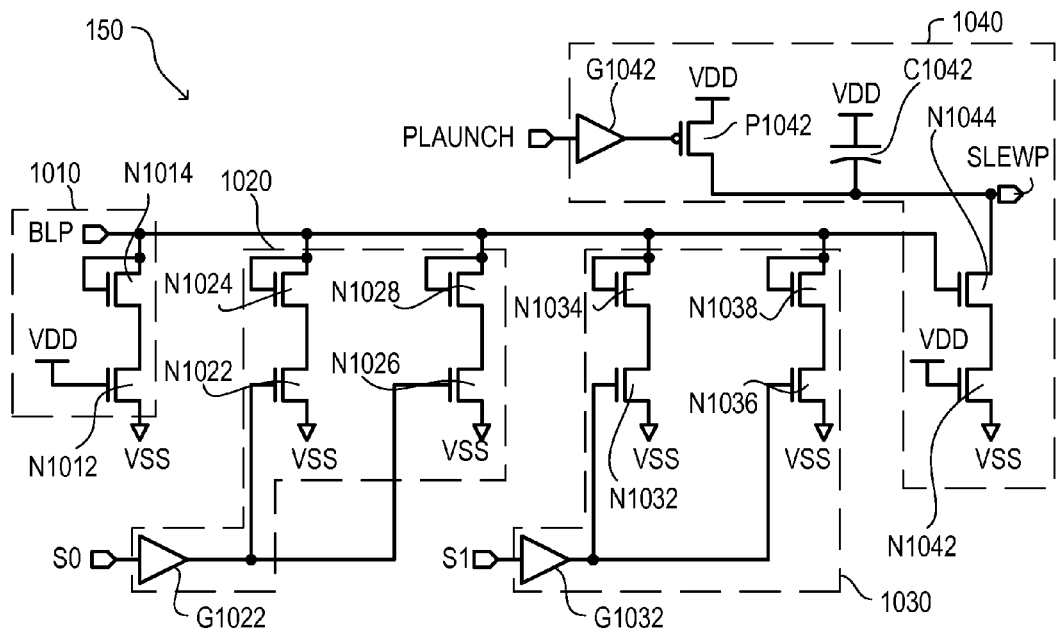
FIG. 10 is a circuit schematic diagram of a current division slew circuit according to an embodiment.

Referring now to FIG. 10, a current division slew circuit 150 according to an embodiment is set forth in a circuit schematic diagram.

Current division slew circuit 150 can include current leg circuit 1010, current division circuits (1020 and 1030), and current output slew circuit 1040.

Current leg circuit 1010 may include n-channel IGETs (N1012 and N1014). N-channel IGFET N1012 may have a source terminal connected to ground potential VSS, a gate terminal connected to power supply potential VDD, and a drain commonly connected to a source terminal of n-channel IGFET N1014. N-channel IGFET N1014 can have a gate terminal and drain terminal commonly connected to data line BLP.

Current division circuit 1020 can include an inverter G1022 and N-channel IGFETs (N1022, N1024, N1026, and N1028). Inverter G1022 can receive buffered ratio select signal S0 at an input terminal and may provide an output. N-channel IGFET N1022 may have a source terminal connected to ground potential VSS, a gate terminal connected to receive the output of inverter G1022, and a drain commonly connected to a source terminal of n-channel IGFET N1024. N-channel IGFET N1024 can have a gate terminal and drain terminal commonly connected to data line BLP. N-channel IGFET N1026 may have a source terminal connected to ground potential VSS, a gate terminal connected to receive the output of inverter G1022, and a drain commonly connected to a source terminal of n-channel IGFET N1028. N-channel IGFET N1028 can have a gate terminal and drain terminal commonly connected to data line BLP.

Current division circuit 1030 can include an inverter G1032 and N-channel IGFETs (N1032, N1034, N1036, and N1038). Inverter G1032 can receive buffered ratio select signal S1 at an input terminal and may provide an output. N-channel IGFET N1032 may have a source terminal connected to ground potential VSS, a gate terminal connected to receive the output of inverter G1032, and a drain commonly connected to a source terminal of n-channel IGFET N1034. N-channel IGFET N1034 can have a gate terminal and drain terminal commonly connected to data line BLP. N-channel IGFET N1036 may have a source terminal connected to ground potential VSS, a gate terminal connected to receive the output of inverter G1032, and a drain commonly connected to a source terminal of n-channel IGFET N1038. N-channel IGFET N1038 can have a gate terminal and drain terminal commonly connected to data line BLP.

Current output slew circuit 1040 can include an inverter G1042, p-channel IGFET P1042, n-channel IGFETs (N1042 and N1044) and a capacitor C1042. Inverter G1042 can receive a launch signal PLAUNCH at an input terminal and may provide an output. P-channel IGFET P1042 can have a gate terminal connected to receive the output of inverter G1042, a source terminal connected to power supply potential VDD, and a drain terminal connected to slew signal SLEWP. Capacitor C1042 can have a first terminal connected to slew signal SLEWP and a second terminal connected to power supply potential VDD. N-channel IGFET N1042 may have a source terminal connected to ground potential VSS, a gate terminal connected to power supply potential VDD, and a drain commonly connected to a source terminal of n-channel IGFET N1044. N-channel IGFET N1044 can have a gate terminal connected to data line BLP and a source terminal connected to slew signal SLEWP.

Current division slew circuit 150 may operate in the same manner as current division slew circuit 140 with the exception that the current flowing through current leg 1010 is provided by p-channel IGFET P512 (FIG. 5).

Figure 11:
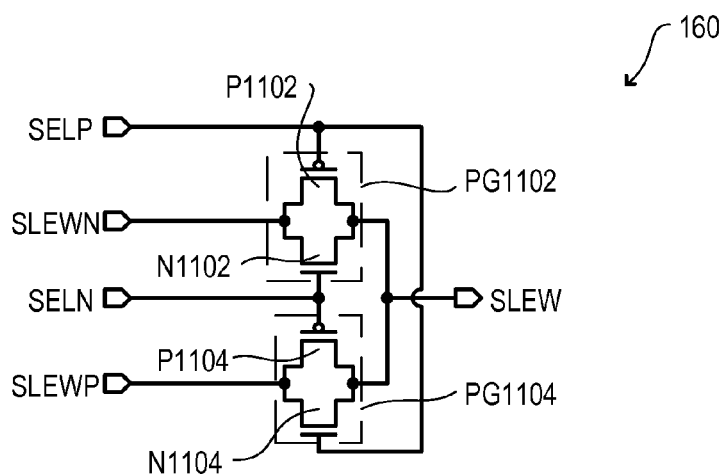
FIG. 11 is a circuit schematic diagram of a multiplexer circuit according to an embodiment.

Referring now to FIG. 11, a multiplexer circuit 160 according to an embodiment is set forth in a circuit schematic diagram.

Multiplexer 160 can include pass gates (PG1102 and PG1104). Pass gate PG1102 can have a controllable impedance path connected between slew signal SLEWN and slew signal SLEW. Pass gate PG1102 can include p-channel IGFET P1102 and n-channel IGFET N1102. P-channel IGFET P1102 and n-channel IGFET N1102 have source/drain paths connected in parallel between slew signal SLEWN and slew signal SLEW. P-channel IGFET P1102 can receive select signal SELP at a gate terminal. N-channel IGFET N1102 can receive select signal SELN at a gate terminal. In this way, pass gate PG1102 can provide a low impedance path between slew signal SLEWN and slew signal SLEW when select signal SELP is at a logic low and select signal SELN is at a logic high and may provide a high impedance path between slew signal SLEWN and slew signal SLEW when select signal SELP is at a logic high and select signal SELN is at a logic low. Pass gate PG1104 can include p-channel IGFET P1104 and n-channel IGFET N1104. P-channel IGFET P1104 and n-channel IGFET N1104 have source/drain paths connected in parallel between slew signal SLEWP and slew signal SLEW. P-channel IGFET P1104 can receive select signal SELN at a gate terminal. N-channel IGFET N1104 can receive select signal SELP at a gate terminal. In this way, pass gate PG1104 can provide a low impedance path between slew signal SLEWP and slew signal SLEW when select signal SELN is at a logic low and select signal SELP is at a logic high and may provide a high impedance path between slew signal SLEWP and slew signal SLEW when select signal SELN is at a logic high and select signal SELP is at a logic low.

Figure 12:
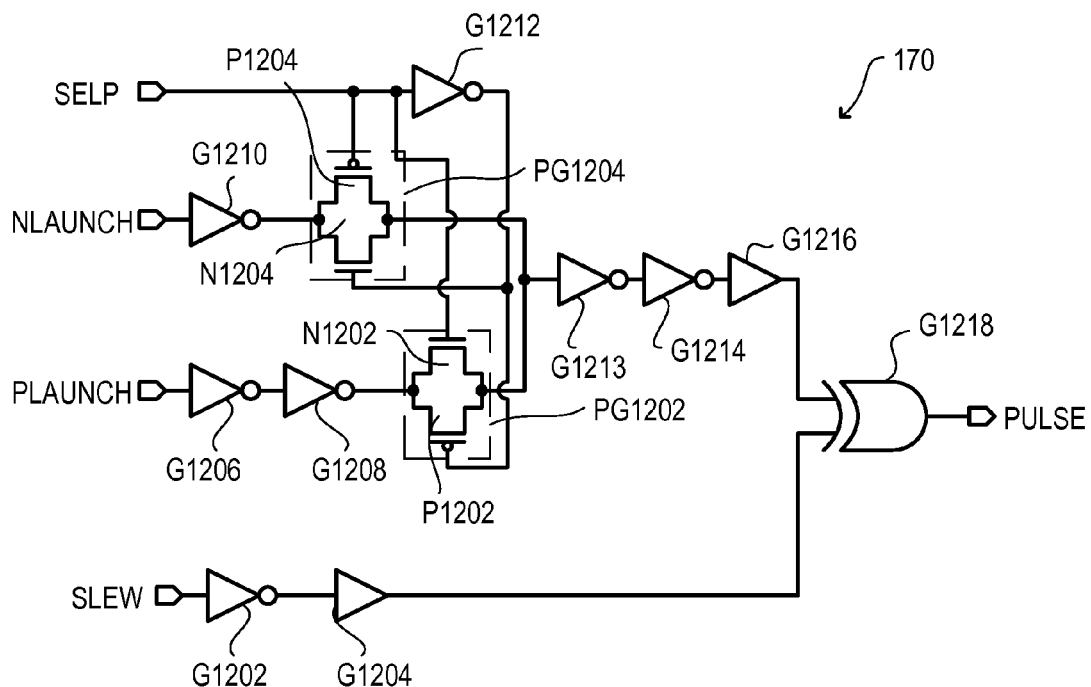
FIG. 12 is a circuit schematic diagram of a pulse generator circuit according to an embodiment.

Referring now to FIG. 12, a pulse generator circuit 170 according to an embodiment is set forth in a circuit schematic diagram.

Pulse generator circuit 170 can include buffers (G1204 and G1216), inverters (G1202, G1206, G1208, G1210, G1212, G1213, and G1214), pass gates (PG1202 and PG1204), and exclusive OR (XOR) gate G1218. Inverter G1202 receives slew signal SLEW at an input terminal and provides an output. Buffer G1204 receives the output of inverter G1202 at an input terminal and provides an output. Inverter G1206 receives launch signal PLAUNCH at an input terminal and provides an output. Inverter G1208 receives the output of inverter G1206 at an input terminal and provides an output. Inverter G1210 receives launch signal NLAUNCH at an input terminal and provides an output. Inverter G1212 receives select signal SELP at an input terminal and provides an output.

Pass gate PG1202 can have a controllable impedance path connected between the output of inverter G1208 and the input terminal of inverter G1213. Pass gate PG1202 can include p-channel IGFET P1202 and n-channel IGFET N1202. P-channel IGFET P1202 and n-channel IGFET N1202 have source/drain paths connected in parallel between the output of inverter G1208 and the input terminal of inverter G1213. P-channel IGFET P1202 can receive the output of inverter G1212 at a gate terminal. N-channel IGFET N1202 can receive select signal SELP at a gate terminal. In this way, pass gate PG1202 can provide a low impedance path between output of inverter G1208 and the input terminal of inverter G1213 when select signal SELP is at a logic high and may provide a high impedance path output of inverter G1208 and the input terminal of inverter G1213 when select signal SELP is at a logic low. Pass gate PG1204 can have a controllable impedance path connected between the output of inverter G1210 and the input terminal of inverter G1213. Pass gate PG1204 can include p-channel IGFET P1204 and n-channel IGFET N1204. P-channel IGFET P1204 and n-channel IGFET N1204 have source/drain paths connected in parallel between the output of inverter G1210 and the input terminal of inverter G1213. N-channel IGFET N1204 can receive the output of inverter G1212 at a gate terminal. P-channel IGFET P1204 can receive select signal SELP at a gate terminal. In this way, pass gate PG1204 can provide a low impedance path between output of inverter G1210 and the input terminal of inverter G1214 when select signal SELP is at a logic low and may provide a high impedance path output of inverter G1210 and the input terminal of inverter G1213 when select signal SELP is at a logic high.

Inverter G1214 may receive the output of inverter G1213 and may provide an output. Buffer G1216 may receive the output of inverter G1214 at an input terminal and may provide an output. XOR gate G1218 may receive the output of buffers (G1204 and G1216) at respective input terminals and may provide pulse signal PULSE as an output.

Figure 13:
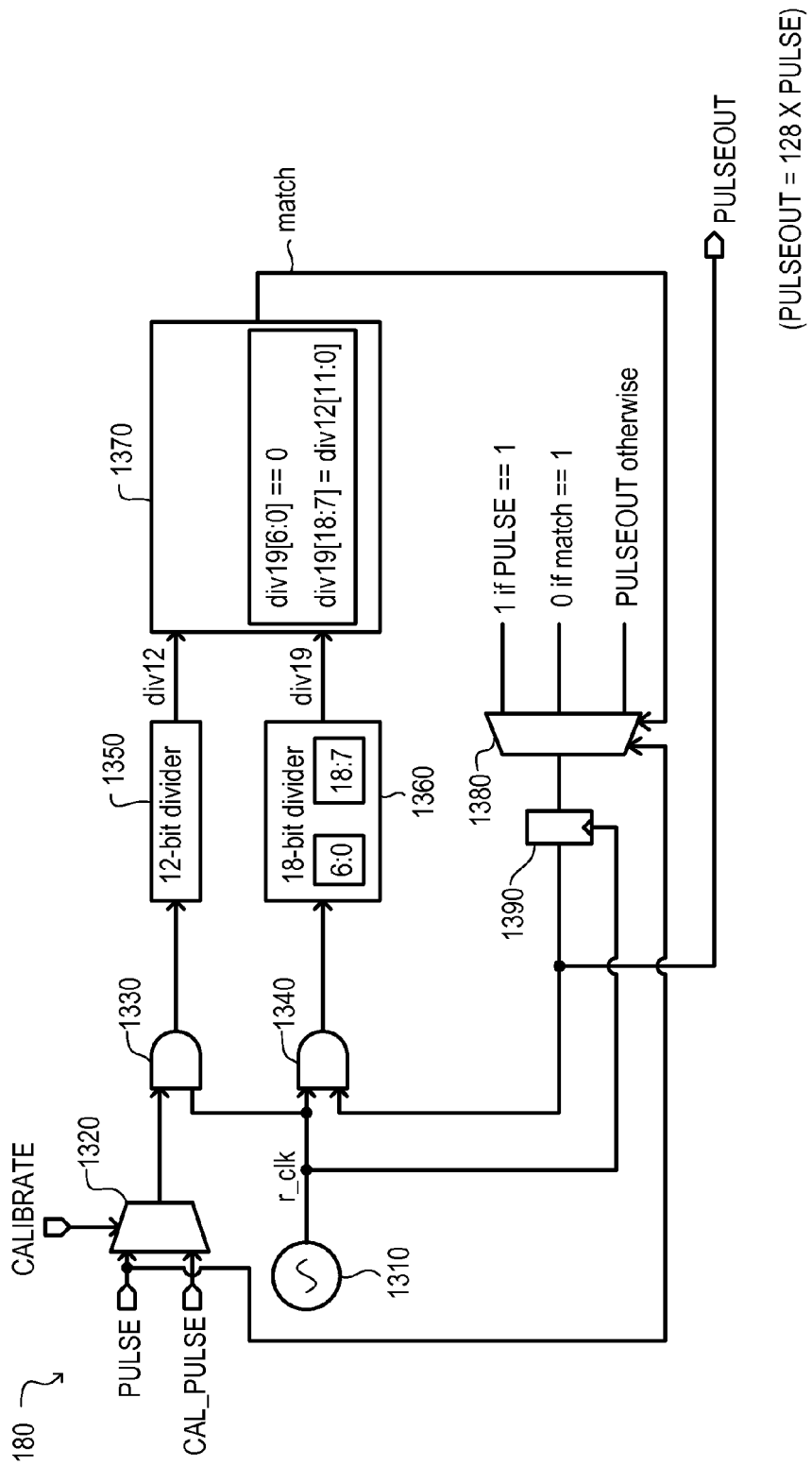
FIG. 13 is a circuit schematic diagram of a pulse width multiplier circuit according to an embodiment.

Referring now to FIG. 13, a pulse width multiplier circuit 180 according to an embodiment is set forth in a schematic diagram.

Pulse width multiplier circuit 180 can include an oscillator circuit 1310, a multiplexer 1320, AND gates (1330 and 1340), divider circuits (1350 and 1360), a comparator 1370, a multiplexer 1380, and a latch circuit 1390.

Oscillator circuit 1310 may provide a clock signal r_clk. Multiplexer 1320 may receive pulse signal PULSE and a calibration pulse signal CAL_PULSE at input terminals and a calibrate signal CALIBRATE at a selection terminal and may provide an output. AND gate 1330 may receive clock signal r_clk and the output of multiplexer 1320 at input terminals and may provide an output. AND gate 1340 may receive clock signal r_clk and pulse signal PULSEOUT at input terminals and may provide an output. Divider circuit 1350 may receive the output of AND gate 1330 at an input terminal and may provide a 12-bit count div12. Divider circuit 1350 may be a 12-bit counter circuit. Divider circuit 1360 may receive the output of AND gate 1340 at an input terminal and may provide a 19-bit count div19. Divider circuit 1360 may be a 19-bit counter circuit. Comparator circuit 1370 may receive 12-bit count div12 and 19-bit count div18 as inputs and may provide a match signal match. Match signal match may be a logic high if the 7 least significant bits (div19 [6:0]) of 19-bit count div19 are all zeroes and the 12 most significant bits (div19[18:7]) of 19-bit count div19 match the 12 bits count div12 (div12[11:0]).

Multiplexer 1380 may receive match signal match and pulse signal PULSE at selection terminals and may provide a logic 1 as an output if pulse signal PULSE is high and match signal match is logic low (indicating no match) and may provide a logic low if match signal match is logic high (indicating a match). Otherwise, multiplexer 1380 may provide pulse signal PULSEOUT as an output. Latch circuit 1390 receives the output of multiplexer 1380 as an input and latches this state on the rising edge of clock signal r_clk to provide pulse signal PULSEOUT.

When calibrate signal CALIBRATE is logic high, a calibration pulse CAL_PULSE of known pulse width may be provided through multiplexer 1320 to calibrate pulse width multiplier circuit 180.

When calibrate signal CALIBRATE is logic low, pulse signal PULSE may be provided through multiplexer 1320 and a pulse signal PULSEOUT may be generated that has essentially a pulse width that is 128 times the pulse width of pulse signal PULSE.

For instance, when pulse signal PULSE transitions from a logic low to a logic high, AND gate 1330 is enabled and the output of AND gate 1330 can toggle in response to clock signal r_clk. Divider circuit 1350 counts the number of clock cycles of clock signal r_clk that occur during pulse signal PULSE being logic high to provide 12-bit count div12. Also at this time, multiplexer 1380 provides a logic 1 output to latch circuit 1390 and pulse signal PULSEOUT transitions from a logic low to a logic high level in response to the first rising edge of clock signal r_clk after pulse signal PULSE transitions to a logic high.

With pulse signal PULSEOUT at a logic high level, AND gate 1340 is enabled and the output of AND gate 1340 can toggle in response to clock signal r_clk. Divider circuit 1360 counts the number of clock cycles of clock signal r_clk that occur during pulse signal PULSEOUT being logic high to provide 19-bit count div19.

Eventually, pulse signal PULSE can transition back to a logic low and AND gate 1330 can be disabled. At this time, 12-bit count div12 has a value corresponding to the total number of clock cycles of clock signal r_clk that occurred during pulse signal PULSE being logic high. In response to pulse signal PULSE transitioning to a logic low, multiplexer 1380 provides pulse signal PULSEOUT as an output. At this time pulse signal PULSEOUT is at a logic high. Latch circuit 1390, provides the logic high as an output at the subsequent rising edge of clock signal r_clk. In this way, pulse signal PULSEOUT may remain at a logic high.

Divider circuit 1360 continues to count the clock cycles of clock signal r_clk to provide 19-bit count div19 until comparator 1370 detects that the 7 least significant bits (div19 [6:0]) of 19-bit count div19 are all zeroes and the 12 most significant bits (div19[18:7]) of 19-bit count div19 match the 12 bits count div12 (div12[11:0]). In response to comparator 1370 detecting a match, match signal match can transition to a logic high and multiplexer 1380 can provide a logic low output. Latch circuit 1390 can output this logic low at the subsequent rising edge of clock signal r_clk and pulse signal PULSEOUT can transition to a logic low. In this way, pulse width multiplier circuit 180 can receive a pulse signal PULSE having a first pulse width and provide a pulse signal PULSEOUT that has a second pulse width that is essentially 128 times the pulse width of the first pulse width.

Figure 14:
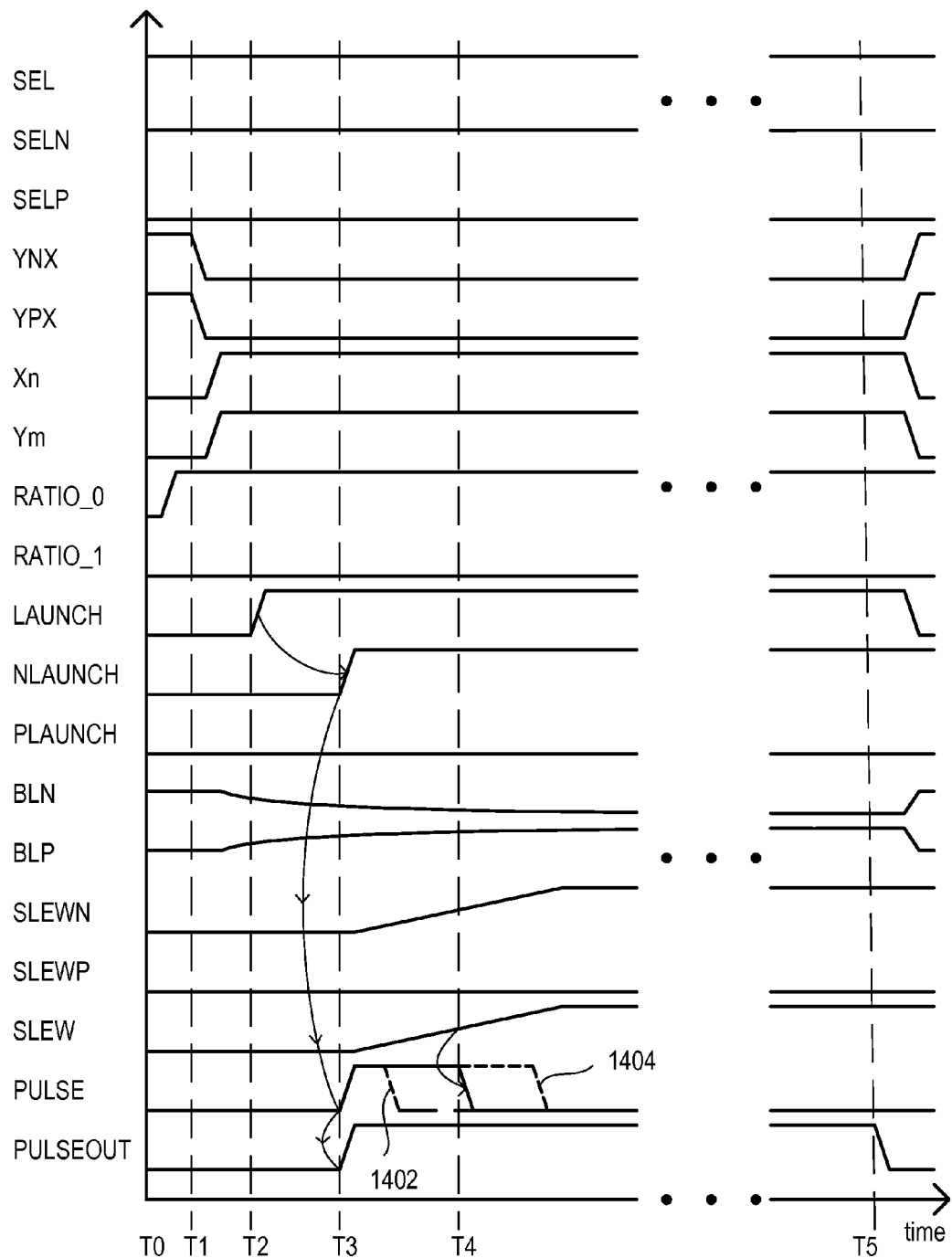
FIG. 14 is a timing diagram illustrating the operation of an SRAM performance monitor circuit according to an embodiment.

FIG. 14 is a timing diagram illustrating the operation of SRAM performance monitor circuit 100 according to an embodiment.

The operation of SRAM performance monitor circuit 100 will now be explained with reference to the timing diagram of FIG. 14 in conjunction with FIGS. 1 to 13.

The timing diagram if FIG. 14 illustrates monitoring a n-channel IGFET N524 in a SRAM cell 520 in a test memory cell 500 in which ratio select signal RATIO_0 is a logic high and ratio select signal RATIO_1 is a logic low.

Select signal SEL can be set to a logic high indicating testing of an n-channel IGFET N524 in a SRAM cell 520 in a test memory cell 500. With select signal SEL at a logic high, buffer G604 can provide select signal SELN at a logic high and inverter G606 may provide select signal SELP at a logic low.

At time T0, precharge signals (YNX and YPX) may be at a logic high and n-channel IGFETs (N320 and N322) and p-channel IGFETs (P320 and P322) may be turned on so that precharge circuit 234 can charge data lines (BLN and BLP) to a reference potential BLR.

Also, at time T0, launch signals (NLAUNCH and PLAUNCH) are at logic low. With launch signal PLAUNCH at a logic low, p-channel IGFET P1042 in current output slew circuit 1040 may be turned on and slew signal SLEWP may be precharged to power supply potential VDD (logic high). With launch signal NLAUNCH at a logic low, n-channel IGFET N1042 in current output slew circuit 940 may be turned on and slew signal SLEWN may be precharged to ground potential VSS (logic low).

With select signal SELP at a logic low and select signal SELN at a logic high, pass gate PG1102 may be turned on and pass gate PG1104 may be turned off. In this way, slew signal SLEWN may be selected and output as slew signal SLEW in multiplexer 160.

With select signal SELP at a logic low, pass gate PG1204 may be turned on and pass gate PG1202 may be turned off in pulse generator circuit 170. In this way, launch signal NLAUNCH may propagate through inverters (G1210, G1213, and G1214) and buffer G1216 to provide a logic high to a first input terminal of XOR circuit G1218. Slew signal SLEW may propagate through inverter G1202 and buffer G1204 to provide a logic high to a second input terminal of XOR circuit G1218. With two logic high inputs, XOR circuit G1218 (which provides logic high for output) may provide a pulse signal having a logic low level.

At time T1, precharge signals (YNX and YPX) may be transition to a logic low and n-channel IGFETs (N320 and N322) and p-channel IGFETs (P320 and P322) may be turned off so that precharge circuit 234 can isolate data lines (BLN and BLP) from reference potential BLR. Shortly after time T1, a row selection signal X1 can transition to a logic high and a column selection signal Y2 can transition to a logic high. With row selection signal Xn at a logic high, the corresponding word line WL1 may transition to a logic high level and n-channel IGFETs (N528 and N526) may be turned on. In this way, a current path through n-channel IGFET N524 may be connected to bit line Bm. With column selection signal Y2 at a logic high level, the corresponding column selection signal YS2 can transition to a high level and N-channel IGFETs (N310 and N312) and p-channel IGFETs (P310 and P312) may be turned on to provide a low impedance path between bit line B2 and data line BLN and between bit line BB2 and data line BLP. Row selection signals (X0, X2, and X3) and column selection signals (Y0, Y1, and Y3) may remain at a logic low. However, it is understood that memory cells 500 may be tested in parallel by activating (logic high) any combination of column selection signals (Y0 to Y3) and row selection signals (X0 to X3).

At time T2, launch signal LAUNCH may transition to a logic high. With select signal SEL at a logic high, inverter G608 can provide a logic high to the input of NAND gate G614. Launch signal LAUNCH may propagate through buffer G602, NAND gate G614, inverter G616 and delay circuit D602 to provide a logic high launch signal NLAUNCH at time T3. Delay circuit D602 can provide a propagation delay that is ensures data line BLN is at a sufficiently low level to provide proper test conditions.

In response to launch signal NLAUNCH transitioning to a logic high the output of buffer G1216 in pulse generator circuit 170 can transition to a logic low. With one input at a logic low and one input at a logic high, XOR circuit G1218 may transition to a logic high at time T3.

Also in response to launch signal NLAUNCH transitioning to a logic high the output of inverter G942 in current output slew circuit 940 current division slew circuit 140 may transition to a logic low. In this way, n-channel IGFET N942 may be turned off.

With ratio select signal RATIO_0 at a logic high and ratio select signal RATIO_1 at a logic low, current division selection circuit 130 may provide buffered ratio select signals (S0 and S1) having a logic high and logic low, respectively. In this way, current division circuit 920 may be enabled and current division circuit 930 may be disabled, such that the current through current leg circuit 910 may be essentially one third of the current flowing through n-channel IGFET N524. This current may be mirrored and may flow through p-channel IGFET P944 to provide charge to capacitor C942 in current output slew circuit 940.

Once the potential of slew signal SLEWN reaches a trip point of inverter G1202 (slew signal SLEW essentially tracks slew signal SLEWN), the output of inverter G1202 transitions from a logic high to a logic low in pulse generator circuit 170. Buffer G1204 may have an output that transitions to a logic low. With both inputs to XOR circuit G1218 at a logic low, pulse signal PULSE may transition to a logic low at time T4.

As described with reference to FIG. 13 above, pulse width multiplier circuit 180 may receive pulse signal PULSE to provide a pulse signal PULSEOUT that has a pulse width that is essentially 128 times the pulse width of pulse signal PULSE. Pulse signal PULSEOUT may transition to a logic high at time T3 in response to pulse signal PULSE and may transition low at time T5 in response to match signal match. In this way, measurement accuracy may be improved.

The timing diagram of FIG. 14 illustrates a pulse signal PULSE having a first pulse edge determined by a logic transition of a launch signal NLAUNCH and a second pulse edge determined by slew signal SLEWN reaching a predetermined potential (the trip point of inverter G1202). In this way, the pulse width of pulse signal PULSE may be determined by the magnitude of the current flowing through n-channel IGFET N524 of SRAM cell 520.

In the timing diagram of FIG. 14, pulse signal PULSE may include dashed waveforms (1402 and 1404). Dashed waveform 1402 can indicate a pulse width when ratio select signals (RATIO_0 and RATIO_1) are both logic low and both current division circuits (920 and 930) are disabled. Dashed waveform 1404 can indicate a pulse width when ratio select signals (RATIO_0 and RATIO_1) are both logic high and both current division circuits (920 and 930) are enabled. Dashed waveform 1404 can function as an adjust pulse based upon a monitoring operation to measure timing current from the bit cell array hitting the slew range in the capacitor, and/or an operation that further performs a program to average out random variations to obtain systematic performance metrics, which in turn can be fed into an output (preferably a digital readout) that characterizes the corner characteristics of the bit cell array. Another benefit to using an array of SRAM transistors is to have identical layout effects to mimic cells used in an actual design—for instance, to simulate effects of transistor variation sources such as random dopant fluctuation, well-proximity effects, gate length differences and other sources of transistor variation. Additionally, not only may there be fluctuation in transistor performance due to random effects, there may be systematic effects at play due to, for instance, overall drift in semiconductor process, which may be monitored by measuring variation in current in SRAM transistors. The data obtained from performing the SRAM transistor measurements using monitors can be analyzed and input into a circuit for determining the appropriate body bias to bring SRAM performance to specification or make adjustments to bring in performance from slow-slow or fast-fast corners. Note that dashed waveform 1404 pulse can be adjusted based upon 128× system clock counts measuring the pulse width, or can be programmed for different clock rate multipliers.

Essentially the same operation as described above applies to the case of pulse signal PULSE having a first pulse edge determined by a logic transition of a launch signal PLAUNCH and a second pulse edge determined by slew signal SLEWP reaching a predetermined potential (the trip point of inverter G1202). For instance, select signal SEL may have a logic low so that launch signal PLAUNCH may transition to a logic high and current division slew circuit 150 may be selected. In this way, the pulse width of pulse signal PULSE may be determined by the magnitude of the current flowing through p-channel IGFET P512 of SRAM cell 510.

Figure 15:
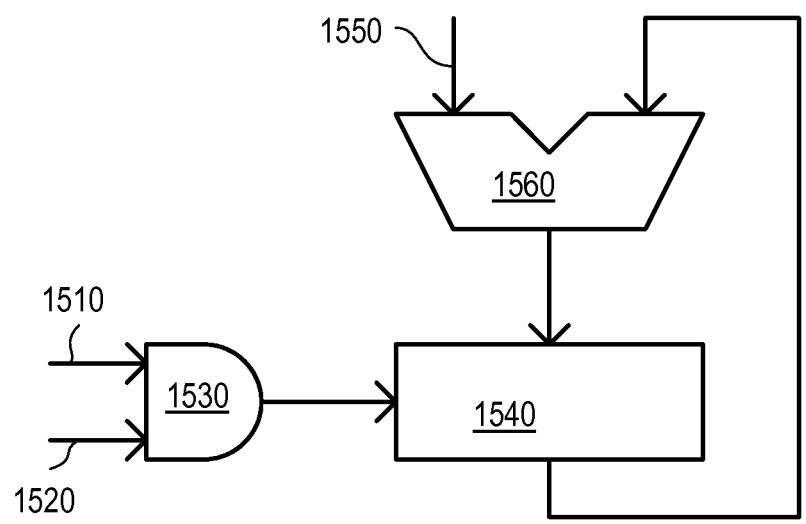
FIG. 15 is a circuit architecture illustrating a method of monitoring transistor performance.

FIG. 15 illustrates how the above-described operation can be implemented. A pulse 1510 (which may be digitally multiplied at a rate of 128×) may be input together with a clock signal 1520 to a timing generator 1530 which may output to an accumulator 1540 (which may be 16-bit) to count the pulses from timing generator 1530. The output from accumulator 1540 may feed to a counter 1560, which performs the function of comparing the pulse counts from the accumulator 1540 against performance benchmark database 1550.

SRAM performance monitor circuit 100 may improve the accuracy of performance measurement of a small current by dividing the current being measured, to generate a pulse signal having a first pulse width proportional to the current magnitude of an IGFET in a SRAM cell. Furthermore, the pulse width may be multiplied to provide a second pulse width that is essentially an integer multiple of the first pulse width. In this way, test equipment may provide a higher resolution measurement and accuracy of performance monitoring may be improved.

Back bias potentials (Vbn and Vbp) may be provided to the SRAM array so that testing may be performed at various back bias potentials (Vbn and Vbp) to provide an optimal desired performance.

The appearance of the phrase "in one embodiment" in various places in the specification do not necessarily refer to the same embodiment. The term "to couple" or "electrically connect" as used herein may include both to directly and to indirectly connect through one or more intervening components. While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. Accordingly, the specifications and drawings are to be regarded in an illustrative rather than a restrictive sense.

What is claimed is:

1. A circuit, comprising:
an array of memory cells including a selected memory cell having a first current flowing through a transistor of a first conductivity type;
a first slew circuit including
a first current leg circuit coupled to receive at least a first portion of the first current; and
a first output circuit, the first output circuit provides a first output current that is essentially the same magnitude as the at least first portion of the first current, the first output current changes the charge on a first capacitor in response to a first launch signal; and
a pulse generator circuit coupled to receive the first launch signal and provide a first pulse signal having a pulse width having a first pulse edge generated in response to the first launch signal and a second pulse edge generated in response to first capacitor reaching a predetermined potential.

2. The circuit of claim 1, further including the step of:
a pulse width multiplier circuit coupled to receive the first pulse signal and provide a second pulse signal having a pulse width that is a predetermined multiple of the pulse width of the first pulse signal.

3. The circuit of claim 1, wherein:
the first current division slew circuit further including a first current division circuit coupled to receive at least a second portion of the first current in response to a first ratio select signal.

4. The circuit of claim 3, wherein:
the first current division slew circuit further including
a second current division circuit coupled to receive at least a third portion of the first current in response to a second ratio select signal.

5. The circuit of claim 1, further comprising:
the selected memory cell having a second current flowing through a transistor of a second conductivity type
a second slew circuit including
a second current leg circuit coupled to receive at least a first portion of the second current; and
a second output circuit, the second output circuit provides a second output current that is essentially the same magnitude as the at least first portion of the second current to change the charge on a second capacitor in response to a second launch signal.

6. The circuit of claim 5, further including:
the pulse generator circuit coupled to receive the first launch signal, the second launch signal, and a select signal and provide the first pulse signal having a pulse width having the first pulse edge selectively generated in response to the first launch signal when the select signal is in a first logic state and in response to the second launch signal when the select signal is in a second logic state, the second pulse edge is generated in response to the first capacitor reaching a predetermined potential when the select signal is in the first logic state and in response to the second capacitor reaching the predetermined potential when the select signal is in the second logic state.

7. The circuit of claim 1, wherein:
the selected memory cell is a static random access memory (SRAM) cell.

8. The circuit of claim 7, wherein:
the SRAM cell includes an access transistor of a second conductivity type having a controllable impedance path coupled between the transistor of the first conductivity type and the first slew circuit; and
a shunt electrically bypassing the controllable impedance path of the access transistor.

9. The circuit of claim 6, wherein:
the plurality of transistors are insulated gate field effect transistors including a structure having a gate overlying a channel, wherein the channel comprises a substantially undoped channel having a relatively high mobility and a heavily doped screen layer lying a predetermined distance below the transistor gate.

10. A method of monitoring the performance of a static random access memory (SRAM) cell, comprising the steps of:
receiving a first current from a first transistor of a first SRAM cell, the first transistor having a first conductivity type;
generating a second current by dividing the first current by an integer greater than or equal to one;
changing the charge on a first capacitor with a third current, the third current has essentially the same magnitude as the second current; and
generating a first pulse signal having a pulse width essentially determined by the magnitude of the third current.

11. The method of claim 10, further including the steps of:
receiving a fourth current from a second transistor of a second SRAM cell, the second transistor having a second conductivity type;

generating a fifth current by dividing the fourth current by an integer greater than or equal to one;

changing the charge on a second capacitor with a sixth current, the sixth current has essentially the same magnitude as the fifth current; and generating the first pulse signal having a pulse width essentially determined by the magnitude of the third current when a select signal has a first logic level and essentially determined by the magnitude of the sixth current when the select signal has a second logic level.

12. The method of claim 11, further including the step of:

generating a second pulse signal having a pulse width that is essentially an integer multiple of the pulse width of the first pulse signal.

13. A circuit, comprising:

an array of static random access memory (SRAM) cells including a first selected SRAM cell having a first current flowing through a transistor of a first conductivity type;

a control circuit coupled to receive a launch select signal and provide a first launch signal, the first launch signal having a first launch enable logic level and a first launch disable logic level; and a first pulse generator circuit coupled to receive the first launch signal, the first pulse generator circuit provides a first pulse signal having a first pulse edge generated in response to the first launch signal transitioning from the first launch disable logic level to the first launch enable logic level and a first pulse width proportional to the magnitude of the first current.

14. The circuit of claim 13, wherein:

the control circuit includes a first delay circuit coupled to receive the launch select signal and an output coupled to provide the first launch signal.

15. The circuit of claim 13, further including:

a first slew circuit coupled to receive the first launch signal, the first slew circuit having a first slew output current proportional to the first current, the first output current changes the charge on a first capacitor at a first slew circuit output terminal in response to the first launch signal having the first launch enable logic level wherein the first pulse signal has a second pulse edge generated in response to the first slew circuit output terminal reaching a predetermined potential.

16. The circuit of claim 15, wherein:

the first slew circuit further coupled to receive a first ratio section signal, the first slew circuit further including a first current leg circuit coupled to provide a first current path for at least a first portion of the first current; and a first current division circuit coupled to provide a second current path for a second portion of the first current in response to the first ratio selection signal having a first ratio selection logic level, the second current path is disabled in response to the first ratio selection signal having second first ratio selection logic level.

17. The circuit of claim 15, wherein:

the first slew circuit further coupled to receive a second ratio section signal, the first slew circuit further including a second current division circuit coupled to provide a third current path for a third portion of the first current in response to the second ratio selection signal having a first second ratio selection logic level, the third current path is disabled in response to the second ratio selection signal having a second ratio selection logic level.

18. The method of claim 13, wherein:

the array of static random access memory (SRAM) cells including a second selected SRAM cell having a second current flowing through a transistor of a second conductivity type;

the control circuit coupled to provide a second launch signal, the second launch signal having a second launch enable logic level and a second launch disable logic level;

the first pulse generator circuit coupled to receive, the first launch signal, the second launch signal, and the launch select signal, the first pulse generator circuit provides the first pulse signal having the first pulse edge generated in response to the first launch signal when the launch select signal has a first launch logic level and generates the first pulse signal having the first pulse edge generated in response to the second launch signal when the launch select signal has a second launch logic level, the first pulse width is proportional to the magnitude of the first current when the launch select signal has the first launch logic level and the first pulse width is proportional to the magnitude of the second current when the launch select signal has the second launch logic level.

19. The method of claim 18, wherein:

the control circuit is coupled to receive a launch enable signal, the launch enable signal has a first launch state and a second launch state, the control circuit further includes a second delay circuit coupled to provide the second launch signal, the second launch signal having the second launch enable logic level in response to the launch select signal having the second launch logic level and the launch enable signal having a launch enable logic level.

* * * * *